(12) United States Patent
Pellizzer et al.

(10) Patent No.: US 10,998,379 B2
(45) Date of Patent: May 4, 2021

(54) THREE DIMENSIONAL MEMORY ARRAYS

(71) Applicant: Micron Technology, Inc., Boise, ID (US)

(72) Inventors: Fabio Pellizzer, Boise, ID (US);
Russell L. Meyer, Boise, ID (US);
Agostino Pirovano, Milan (IT);
Lorenzo Fratin, Buccinasco (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/656,824

(22) Filed: Oct. 18, 2019

(65) Prior Publication Data

US 2020/0052035 A1  Feb. 13, 2020

Related U.S. Application Data

(62) Division of application No. 15/710,972, filed on Sep. 21, 2017, now Pat. No. 10,490,602.

(51) Int. Cl.
*G11C 13/00* (2006.01)
*H01L 27/24* (2006.01)
*H01L 45/00* (2006.01)

(52) U.S. Cl.
CPC .......... *H01L 27/249* (2013.01); *G11C 13/003* (2013.01); *G11C 13/004* (2013.01);
(Continued)

(58) Field of Classification Search
CPC .......................................... G11C 5/06
(Continued)

(56) References Cited

U.S. PATENT DOCUMENTS 8,729,523 B2  5/2014 Pio
9,443,910 B1  9/2016 Fujiwara et al.
(Continued)

FOREIGN PATENT DOCUMENTS

KR  10-2015-0140067 A  12/2015
TW  201419449 A1  5/2014
TW  201515197 A1  4/2015

OTHER PUBLICATIONS

Office Action from related Taiwanese Patent Application Serial No. 107129878, dated Nov. 20, 2019, 12 pages.
(Continued)

*Primary Examiner* — Min Huang
(74) *Attorney, Agent, or Firm* — Brooks, Cameron & Huebsch, PLLC

(57) ABSTRACT

The present disclosure includes three dimensional memory arrays. An embodiment includes a first plurality of conductive lines separated from one another by an insulation material, a second plurality of conductive lines arranged to extend substantially perpendicular to and pass through the first plurality of conductive lines and the insulation material, and a storage element material formed between the first and second plurality of conductive lines where the second plurality of conductive lines pass through the first plurality of conductive lines. The storage element material is between and in direct contact with a first portion of each respective one of the first plurality of conductive lines and a portion of a first one of the second plurality of conductive lines, and a second portion of each respective one of the first plurality of conductive lines and a portion of a second one of the second plurality of conductive lines.

14 Claims, 34 Drawing Sheets

(52) U.S. Cl.
CPC .......... *G11C 13/0069* (2013.01); *H01L 45/06* (2013.01); *H01L 45/1226* (2013.01); *H01L 45/1253* (2013.01); *H01L 45/144* (2013.01); *H01L 45/16* (2013.01); *H01L 45/1608* (2013.01); *G11C 13/0004* (2013.01); *G11C 2213/71* (2013.01)

(58) Field of Classification Search
USPC .......................................................... 365/63
See application file for complete search history.

(56) References Cited

U.S. PATENT DOCUMENTS

| | | | |
|---|---|---|---|
| 10,490,602 B2* | 11/2019 | Pellizzer | G11C 13/0069 |
| 2011/0140068 A1 | 6/2011 | Ozawa et al. | |
| 2012/0161094 A1 | 6/2012 | Huo | |
| 2013/0094273 A1* | 4/2013 | Chien | H01L 27/0688 |
| | | | 365/63 |
| 2013/0210211 A1 | 8/2013 | Vereen | |
| 2013/0288391 A1 | 10/2013 | Lee | |
| 2014/0061574 A1* | 3/2014 | Pio | H01L 27/101 |
| | | | 257/5 |
| 2014/0061575 A1 | 3/2014 | Pio | |
| 2014/0217349 A1 | 8/2014 | Hopkins | |
| 2014/0264353 A1 | 9/2014 | Lai | |
| 2014/0332748 A1 | 11/2014 | Khoueir et al. | |
| 2014/0361239 A1* | 12/2014 | Ramaswamy | H01L 27/2418 |
| | | | 257/5 |
| 2015/0054057 A1 | 2/2015 | Hung et al. | |
| 2015/0106560 A1 | 4/2015 | Perego | |
| 2015/0214241 A1 | 7/2015 | Lee | |
| 2017/0125484 A1 | 5/2017 | Pellizzer | |
| 2017/0206954 A1* | 7/2017 | Lee | G11C 13/0033 |

OTHER PUBLICATIONS

U.S. Appl. No. 15/482,016 entitled "Three Dimensional Memory Array", filed Apr. 7, 2017, 43 pages.

International Search Report and Written Opinion from related international application No. PCT/US2018/047149, dated Dec. 6, 2018, 15 pages.

Office Action from related Korean Patent Application Serial No. 10-2020-7011365, dated Jan. 28, 2021, 14 pages.

* cited by examiner

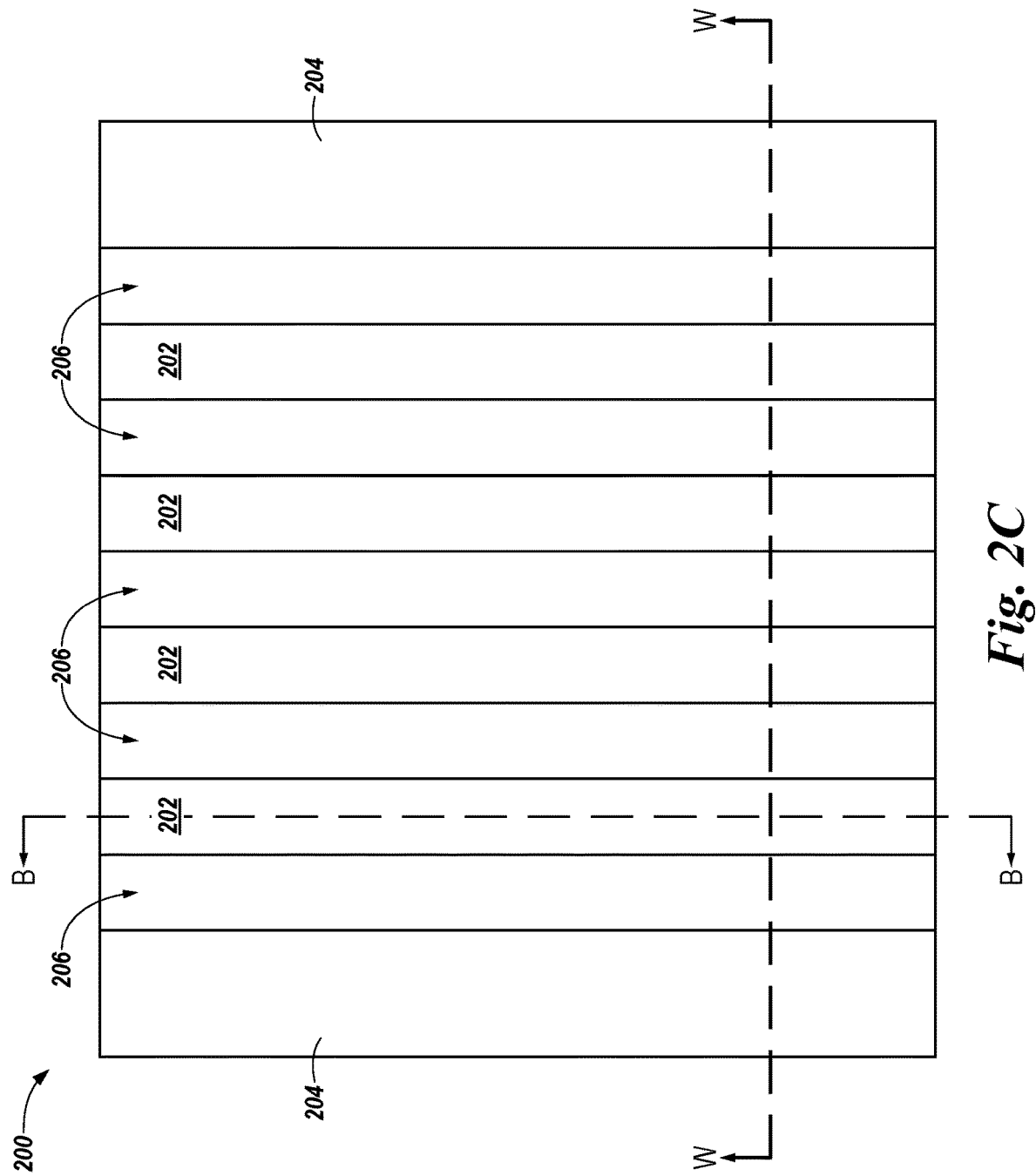

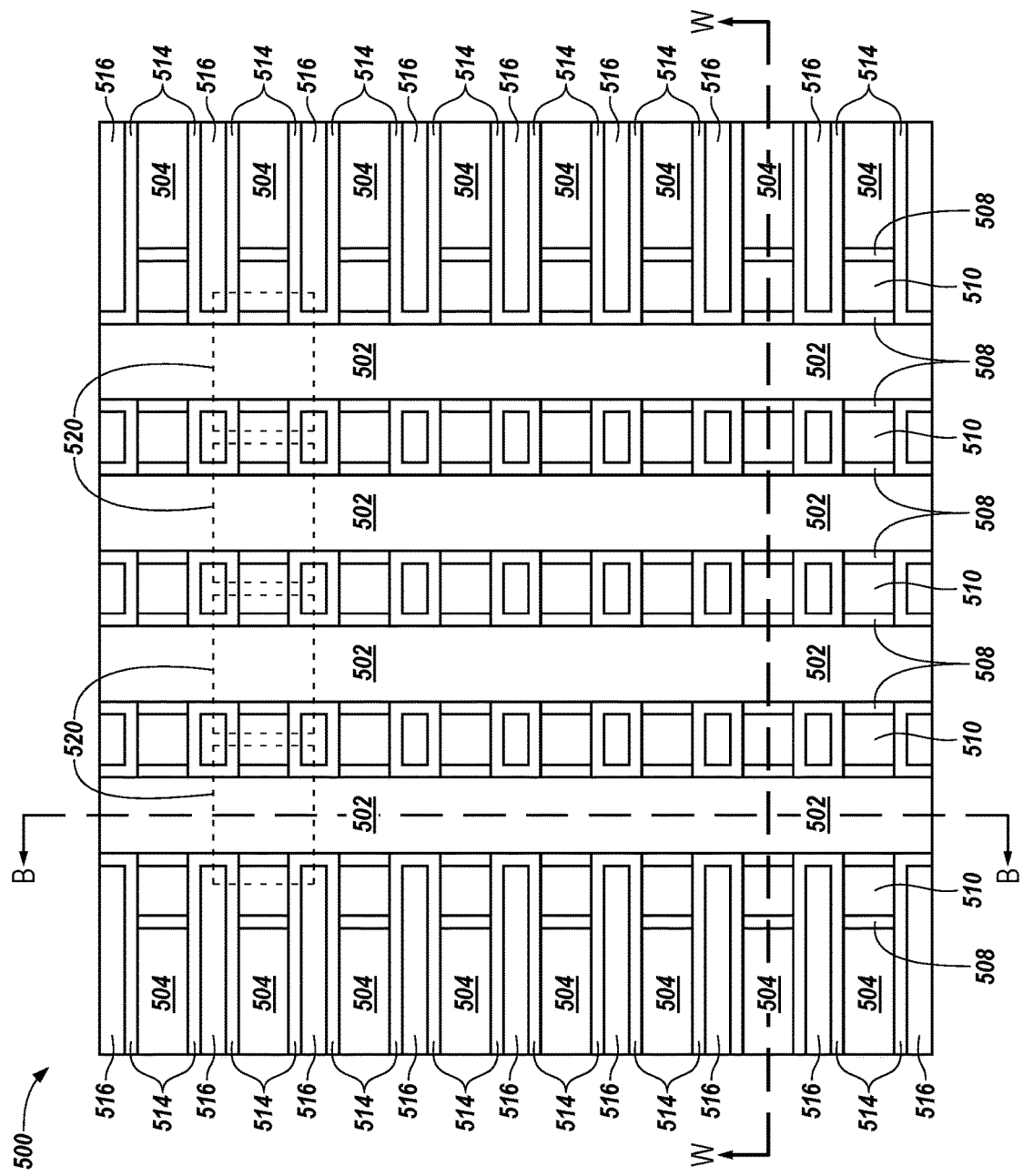

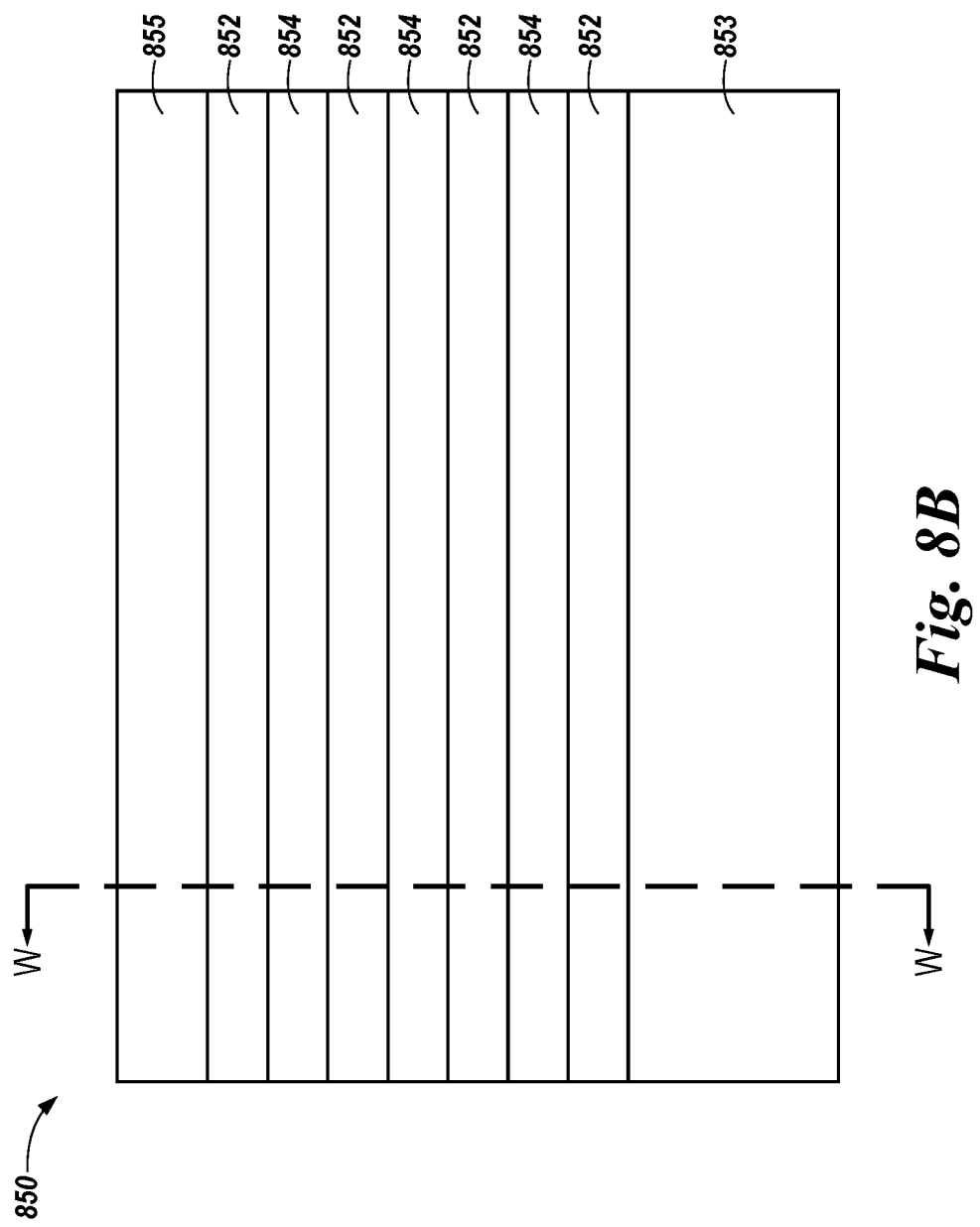

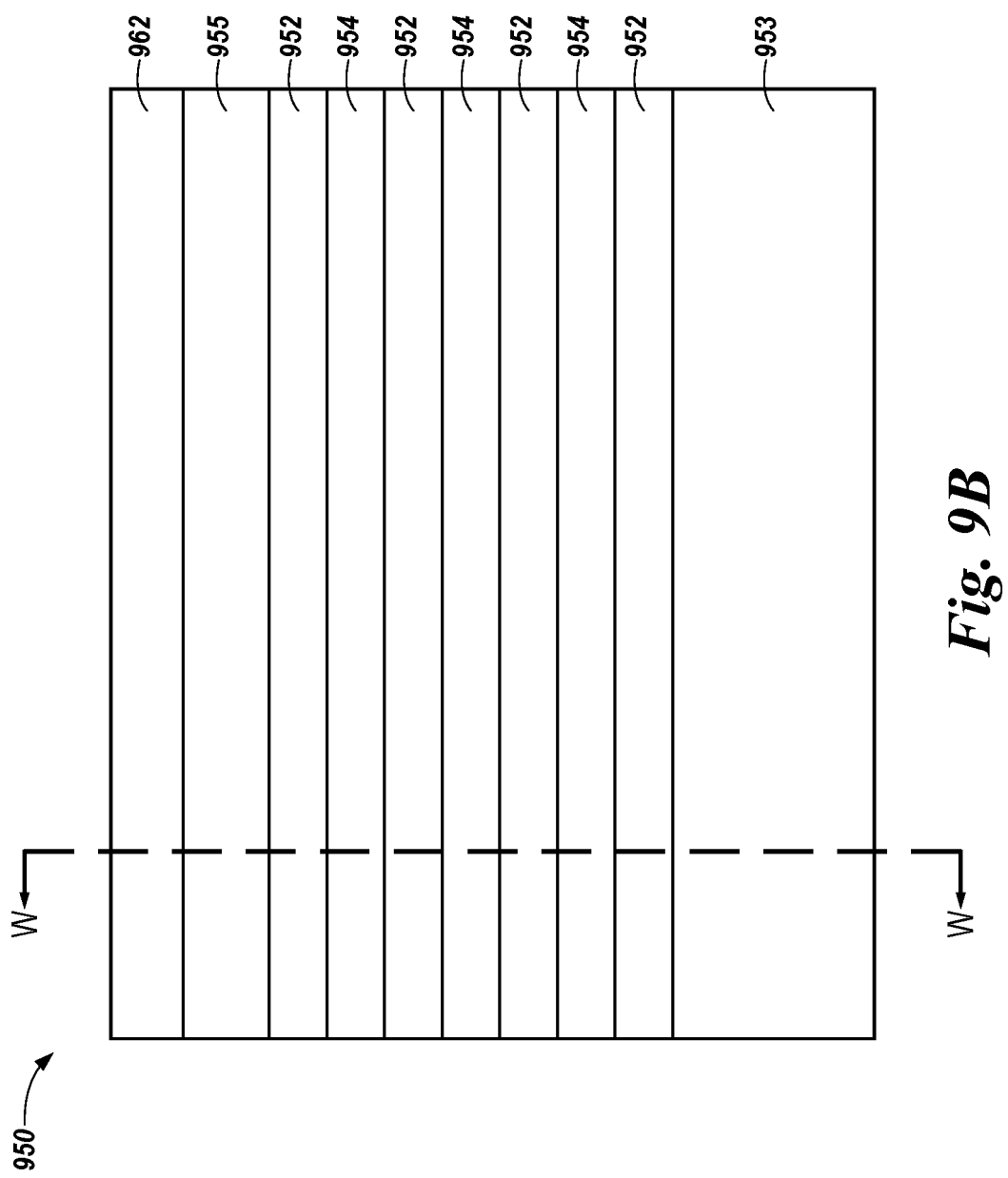

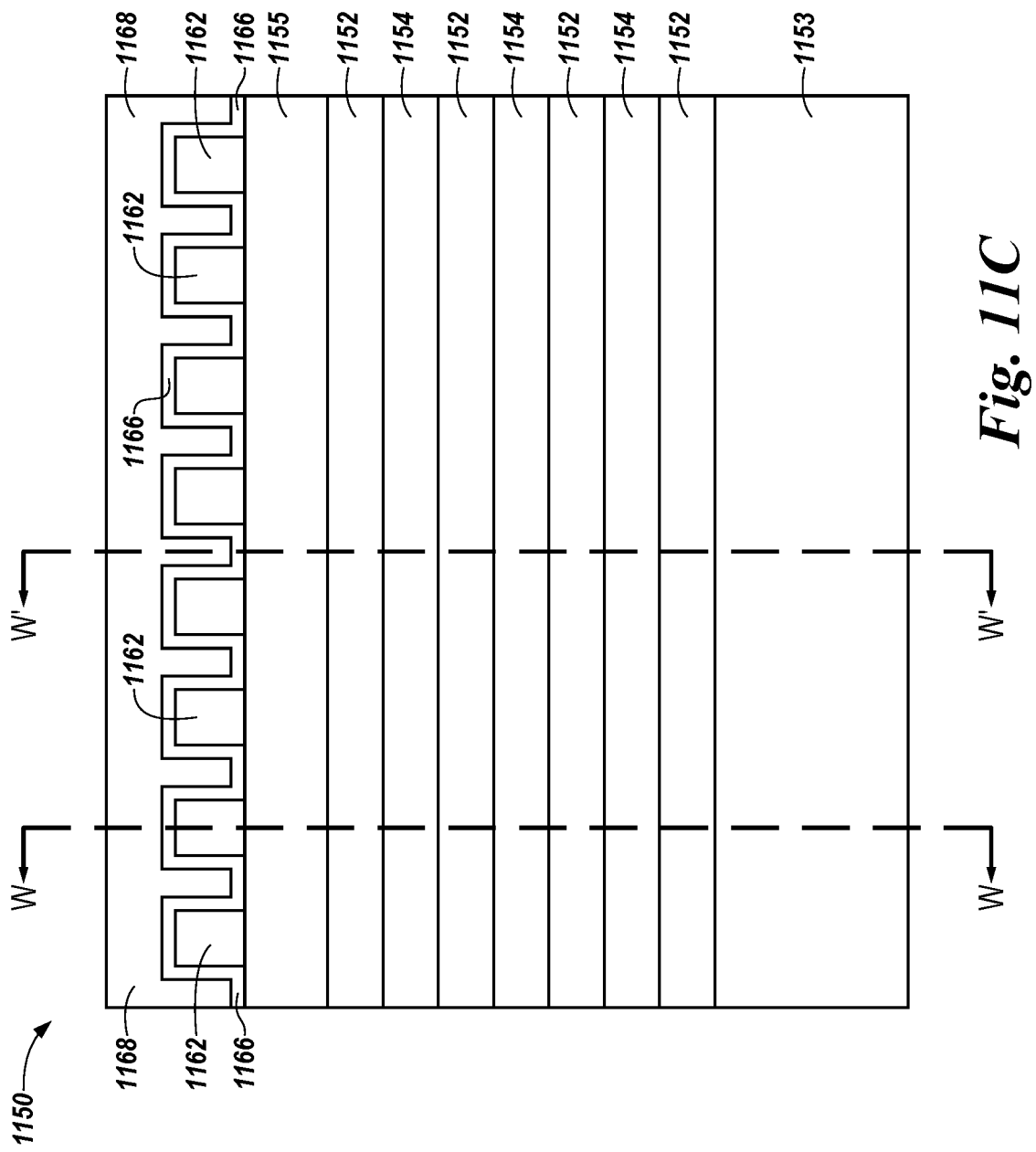

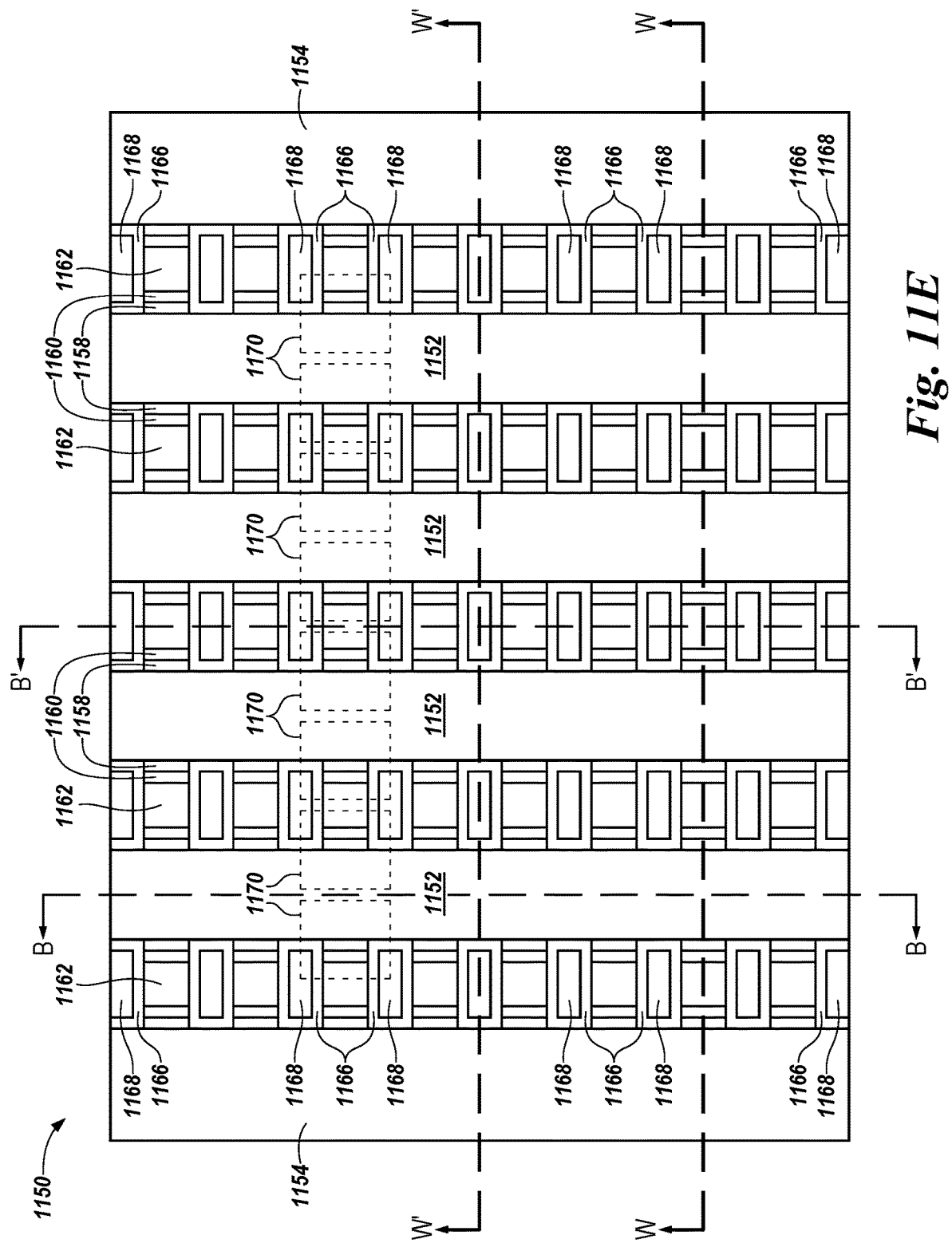

THREE DIMENSIONAL MEMORY ARRAYS

PRIORITY INFORMATION

This application is a divisional of U.S. application Ser. No. 15/710,972, filed on Sep. 21, 2017, the contents of which are incorporated herein by reference.

TECHNICAL FIELD

The present disclosure relates generally to semiconductor memory and methods, and more particularly, to three dimensional memory arrays.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Resistance variable memory devices can include resistive memory cells that can store data based on the resistance state of a storage element (e.g., a resistive memory element having a variable resistance). As such, resistive memory cells can be programmed to store data corresponding to a target data state by varying the resistance level of the resistive memory element. Resistive memory cells can be programmed to a target data state (e.g., corresponding to a particular resistance state) by applying sources of an electrical field or energy, such as positive or negative electrical pulses (e.g., positive or negative voltage or current pulses) to the cells (e.g., to the resistive memory element of the cells) for a particular duration. A state of a resistive memory cell can be determined by sensing current through the cell responsive to an applied interrogation voltage. The sensed current, which varies based on the resistance level of the cell, can indicate the state of the cell.

One of a number of data states (e.g., resistance states) can be set for a resistive memory cell. For example, a single level memory cell (SLC) can be programmed to a targeted one of two different data states, which can be represented by the binary units 1 or 0 and can depend on whether the cell is programmed to a resistance above or below a particular level. As an additional example, some resistive memory cells can be programmed to a targeted one of more than two data states (e.g., 1111, 0111, 0011, 1011, 1001, 0001, 0101, 1101, 1100, 0100, 0000, 1000, 1010, 0010, 0110, and 1110). Such cells may be referred to as multi state memory cells, multiunit cells, or multilevel cells (MLCs). MLCs can provide higher density memories without increasing the number of memory cells since each cell can represent more than one digit (e.g., more than one bit).

BRIEF DESCRIPTION OF THE DRAWINGS

FIGS. 2A-2C illustrate various views of a subsequent processing step associated with forming the three dimensional memory array in accordance with an embodiment of the present disclosure.

FIGS. 5A-5E illustrate various views of a subsequent processing step associated with forming the three dimensional memory array in accordance with an embodiment of the present disclosure.

FIGS. 8A-8C illustrate various views of a subsequent processing step associated with forming the three dimensional memory array in accordance with an embodiment of the present disclosure.

FIGS. 9A-9C illustrate various views of a subsequent processing step associated with forming the three dimensional memory array in accordance with an embodiment of the present disclosure.

FIGS. 11A-11E illustrate various views of a subsequent processing step associated with forming the three dimensional memory array in accordance with an embodiment of the present disclosure.

DETAILED DESCRIPTION

Figure 1:
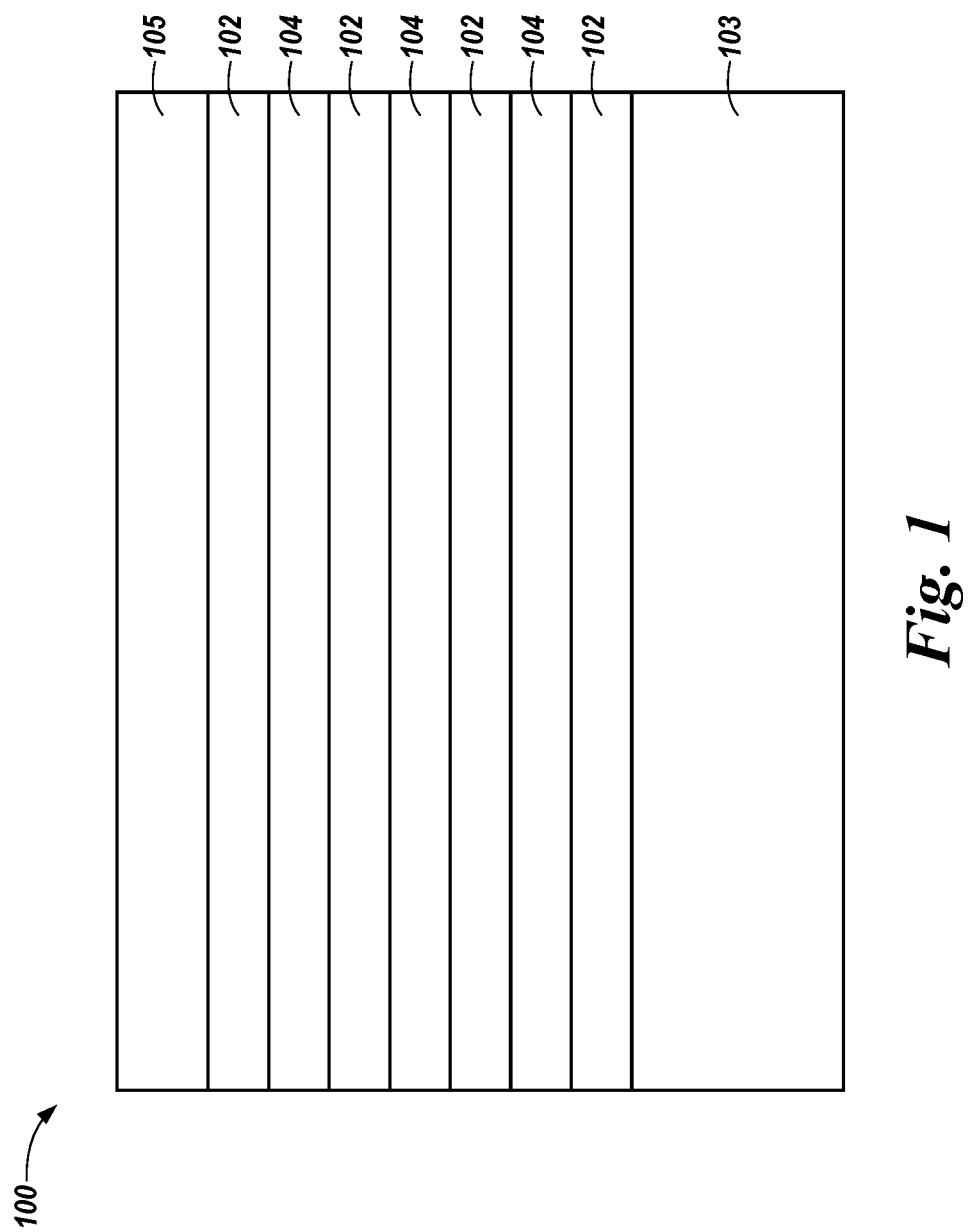
FIG. 1 illustrates a view of a processing step associated with forming a three dimensional memory array in accordance with an embodiment of the present disclosure.

The present disclosure includes three dimensional memory arrays, and methods of processing the same. A number of embodiments include a first plurality of conductive lines separated from one another by an insulation material, a second plurality of conductive lines arranged to extend substantially perpendicular to and pass through the first plurality of conductive lines and the insulation material, and a storage element material formed between the first plurality of conductive lines and the second plurality of conductive lines where the second plurality of conductive lines pass through the first plurality of conductive lines, such that the storage element material is between and in direct contact with a first portion of each respective one of the first plurality of conductive lines and a portion of a first one of the second plurality of conductive lines, and the storage element material is between and in direct contact with a second portion of each respective one of the first plurality of conductive lines and a portion of a second one of the second plurality of conductive lines.

The density of the memory cells of three dimensional memory arrays in accordance with the present disclosure may be greater than the density of memory cells of previous three dimensional memory arrays. For example, the memory cells of three dimensional memory arrays in accordance with the present disclosure may be arranged in a more compact manner than the memory cells of previous three dimensional memory arrays. As such, three dimensional memory arrays in accordance with the present disclosure may have a greater number of memory cells per unit area than previous three dimensional memory arrays.

Further, the memory cells of three dimensional memory arrays in accordance with the present disclosure may have a reduced contact area between the storage element of the cell and the conductive lines (e.g., data lines and access lines) of the cell as compared with memory cells of previous three dimensional memory arrays. This reduction in contact area can increase the performance of three dimensional memory arrays in accordance with the present disclosure (e.g., the performance of a memory device that includes such arrays) as compared with the performance of previous three dimensional memory arrays.

For example, the reduction of the contact area can reduce the programming current used to program the cells to their target data state as compared with the programming current used to program the cells of previous three dimensional memory arrays. As an additional example, the reduction of the contact area can improve the voltage threshold window of the storage element of the cells, which can enhance the sensing window for determining the state of the cells as compared to the cells of previous three dimensional memory arrays.

As used herein, "a" or "an" can refer to one or more of something, and "a plurality of" can refer to more than one of such things. For example, a memory cell can refer to one or more memory cells, and a plurality of memory cells can refer to two or more memory cells.

The figures herein follow a numbering convention in which the first digit or digits correspond to the drawing figure number and the remaining digits identify an element or component in the drawing. Similar elements or components between different figures may be identified by the use of similar digits. For example, 102 may reference element "02" in FIG. 1, and a similar element may be referenced as 202 in FIGS. 2A-2C.

FIG. 1 illustrates a view of a processing step associated with forming a three dimensional memory array (referred to as 100 in FIG. 1) in accordance with an embodiment of the present disclosure. For example, FIG. 1 illustrates a schematic cross-sectional view of the processing step.

FIG. 1 shows the formation (e.g., deposition) of a conductive line material 102 in a plurality of horizontally oriented planes vertically separated from one other by an insulation material 104. For instance, as shown in FIG. 1, a first conductive line material 102 can be formed over an insulation material (e.g., substrate) 103, a first insulation material 104 can be formed on the first conductive line material, a second conductive line material 102 can then be formed on the first insulation material, a second insulation material 104 can then be formed on the second conductive line material, and the formation of conductive line material 102 and insulation material 104 can continue in such an alternating manner, with an insulation material 105 formed on the last (e.g., top) conductive line material 102.

Conductive line material 102 can comprise (e.g., be formed of) a metallic (or semi-metallic) material or a semiconductor material such as a doped polysilicon material, among others. Insulation materials 103, 104, and 105 can be, for example, dielectric materials, such as, for instance, silicon oxide, silicon nitride, or silicon oxynitride. In an embodiment, insulation materials 103, 104, and/or 105 can comprise the same dielectric material. In an additional embodiment, insulation materials 103, 104, and 105 can each comprise different dielectric materials.

Each respective one of the plurality of planes can be at (e.g., form) a different level of the three dimensional memory array, such as, for instance, a different elevation, deck, or plane of the array. For example, each respective conductive line material 102 can be a different (e.g., separate) data line (e.g., bit line) of the array. Although four such levels are shown in the embodiment illustrated in FIG. 1, embodiments of the present disclosure are not limited to this quantity.

Figure 2A:
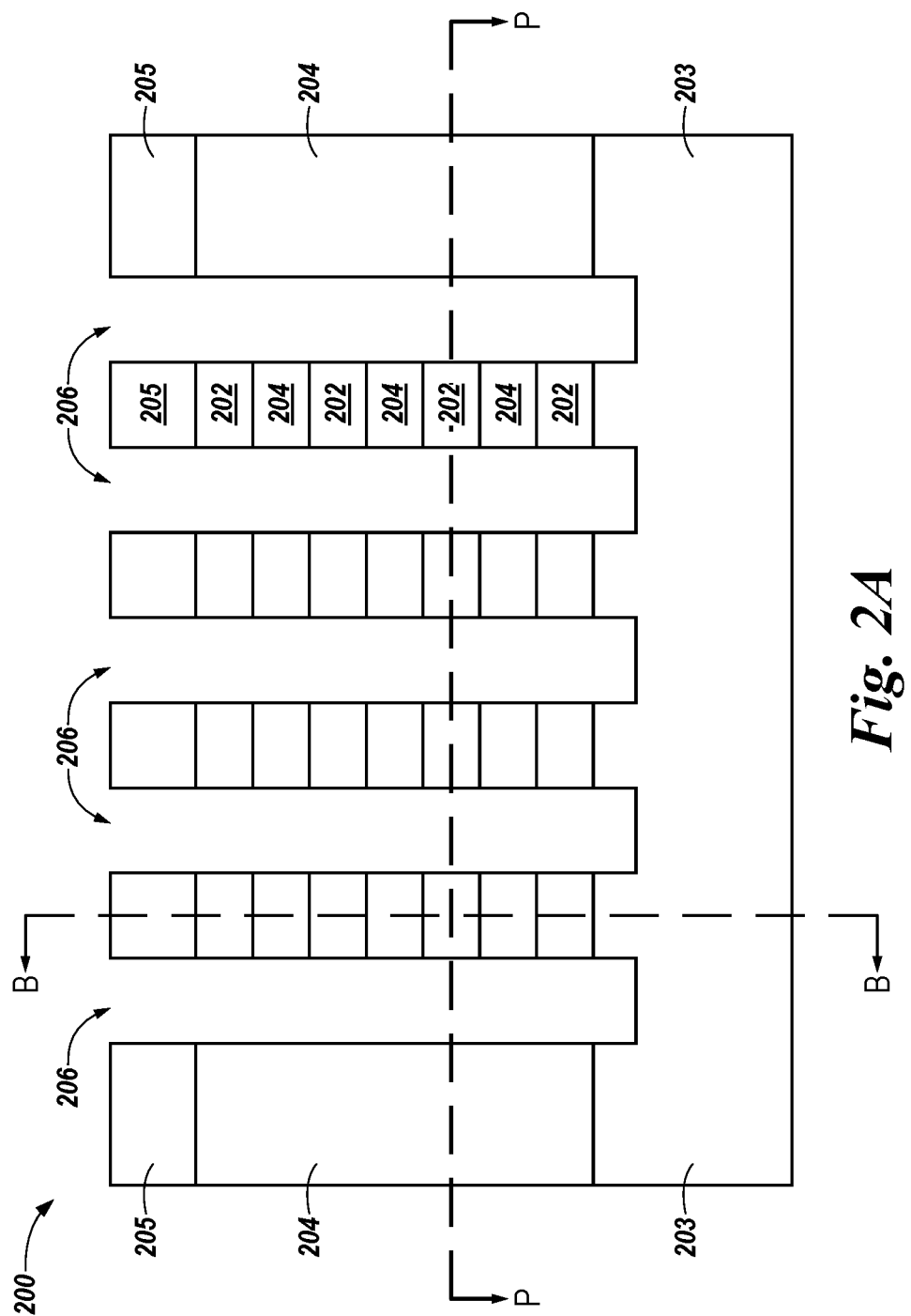
Figure 2B:
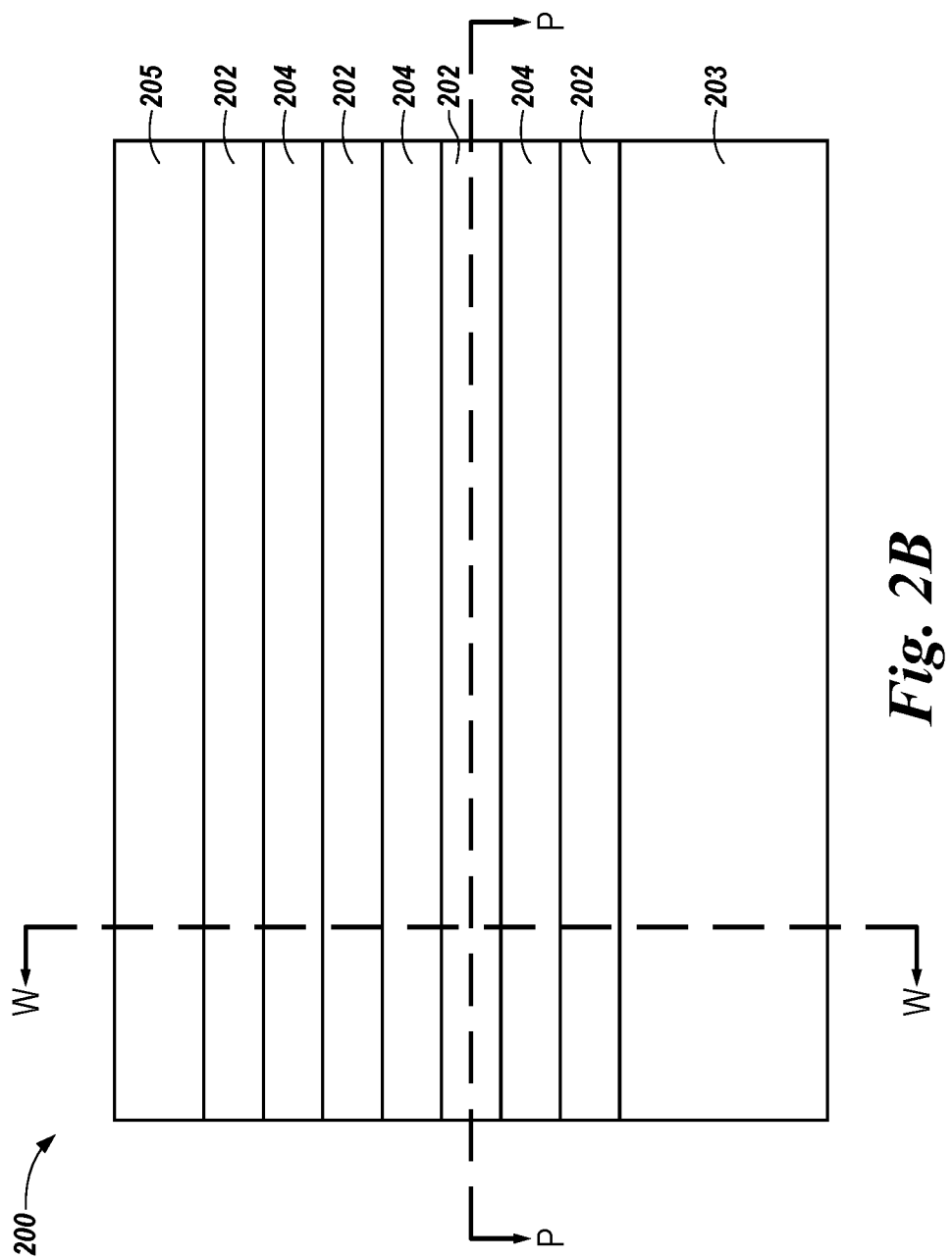

FIGS. 2A-2C illustrate various views of a subsequent processing step associated with forming the three dimensional memory array (referred to as 200 in FIGS. 2A-2C) in accordance with an embodiment of the present disclosure. For example, FIG. 2A illustrates a schematic cross-sectional view, along cut line W-W shown in FIGS. 2B and 2C, of the structure shown in FIG. 1 after the subsequent processing step. Further, FIG. 2B illustrates a schematic cross-sectional view, along cut line B-B shown in FIGS. 2A and 2C, of the structure shown in FIG. 1 after the subsequent processing step. Further, FIG. 2C illustrates a top view, along cut line P-P shown in FIGS. 2A and 2B, of the structure shown in FIG. 1 after the subsequent processing step.

As shown in FIGS. 2A-2C, a plurality of openings (e.g., vias or holes) 206 can be formed (e.g., etched and/or patterned) through insulation material 205, the alternating conductive line material 202 and insulation material 204, and into insulation material 203, such that insulation material 203 forms the bottom of each respective opening, and insulation material 205 and the alternating conductive line material 202 and insulation material 204 form the sidewalls of each respective opening. For example, the plurality of openings 206 can be formed through the alternating conductive line material 202 and insulation material 204 such that at least a portion of each respective opening 206 passes through each respective conductive line material 202 and insulation material 204 (e.g., through each respective plane of the array), as illustrated in FIGS. 2A-2C. By forming openings 206, portions of conductive line material 202 can be removed such that the resulting area of conductive line material 202 may exclude the area removed in forming openings 206.

Each of the plurality of openings 206 can be formed at the same time. For instance, each of the plurality of openings 206 can be formed in a single etch and/or pattern using a single mask. Although five such openings are shown in the embodiment illustrated in FIGS. 2A-2C, embodiments of the present disclosure are not limited to this quantity.

As shown in FIGS. 2A-2C, each respective opening 206 can be formed in the same shape and size. For example, in the embodiment illustrated in FIGS. 2A-2C, each respective opening 206 can be rectangular shaped. However, embodiments of the present disclosure are not limited to a particular shape and/or size for openings 206. For example, circular, oval, and/or angled shaped openings, among others, may be formed, with sharp or rounded corners.

Figure 3A:
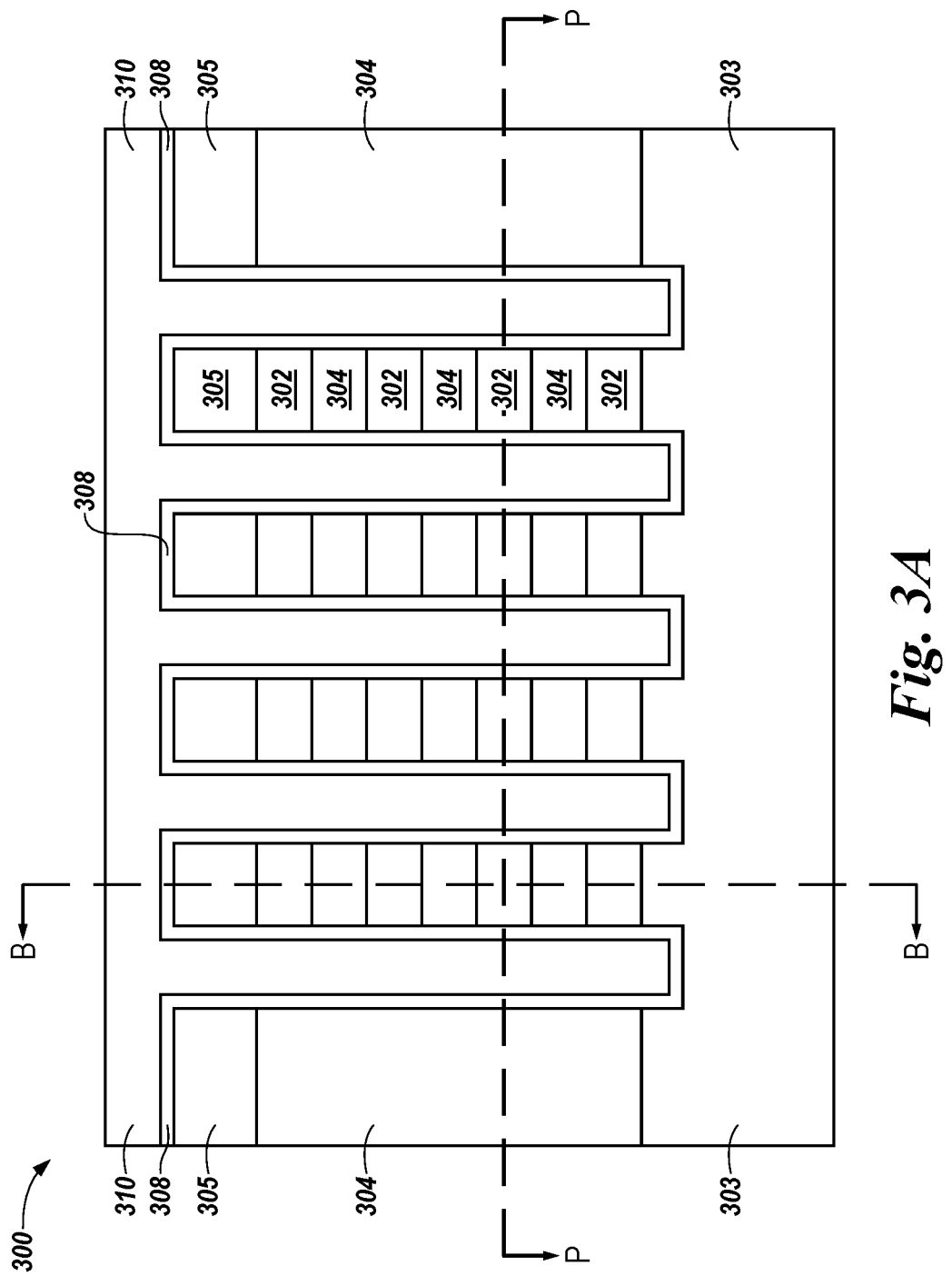
FIGS. 3A-3C illustrate various views of a subsequent processing step associated with forming the three dimensional memory array in accordance with an embodiment of the present disclosure.
Figure 3B:
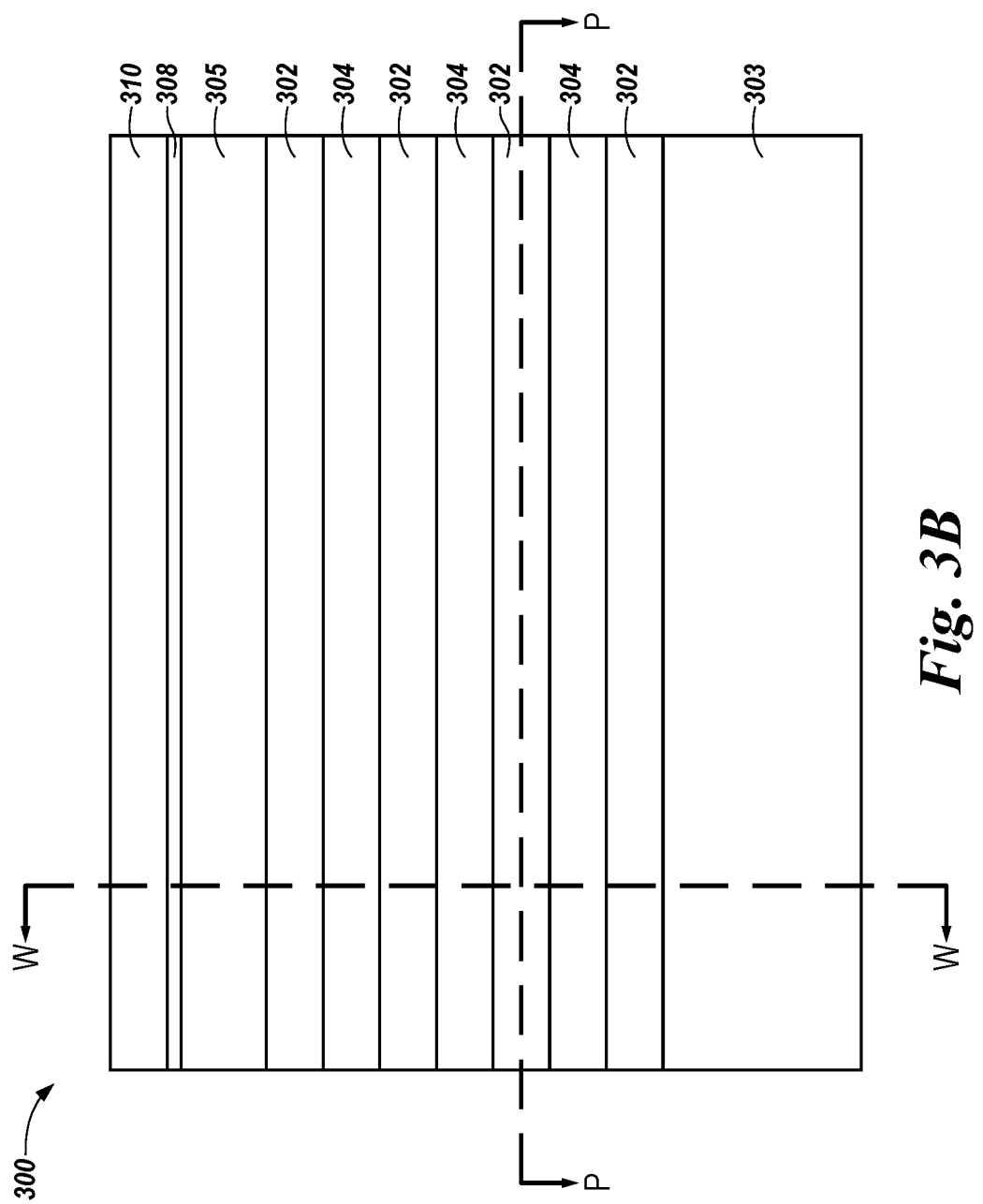
Figure 3C:
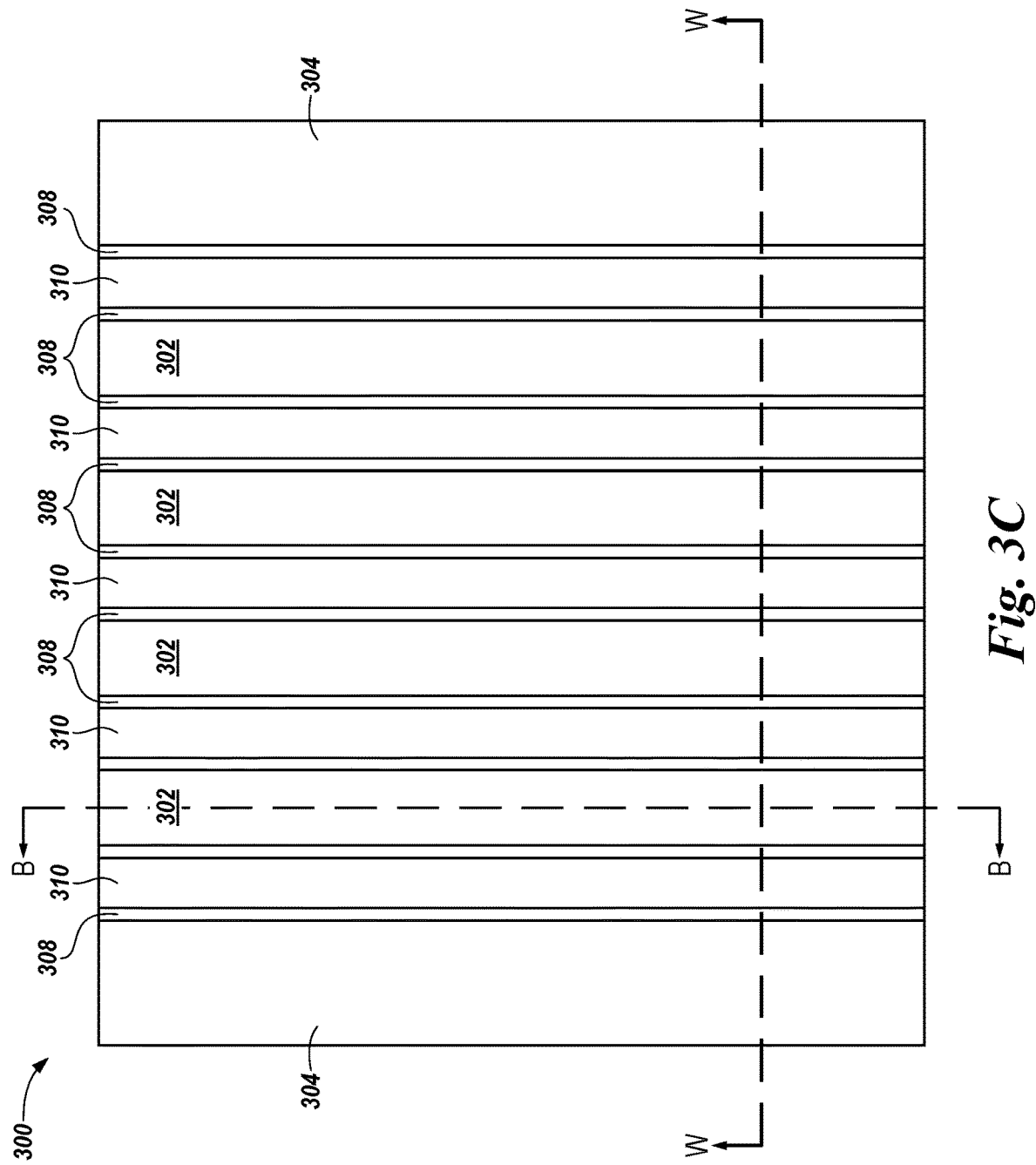

FIGS. 3A-3C illustrate various views of a subsequent processing step associated with forming the three dimensional memory array (referred to as 300 in FIGS. 3A-3C) in accordance with an embodiment of the present disclosure. For example, FIG. 3A illustrates a schematic cross-sectional view, along cut line W-W shown in FIGS. 3B and 3C, of the structure shown in FIGS. 2A-2C after the subsequent processing step. Further, FIG. 3B illustrates a schematic cross-sectional view, along cut line B-B shown in FIGS. 3A and 3C, of the structure shown in FIGS. 2A-2C after the subsequent processing step. Further, FIG. 3C illustrates a top view, along cut line P-P shown in FIGS. 3A and 3B, of the structure shown in FIGS. 2A-2C after the subsequent processing step.

As shown in FIGS. 3A-3C, a storage element material 308 and an additional (e.g., second) conductive line material 310 can be formed in (e.g. fill) the plurality of openings 206. For example, storage element material 308 can be conformally formed (e.g., conformally deposited) on insulation material 305 and in openings 206 such that storage element material 308 is in direct contact with a first portion (e.g., side) of first conductive line material 302 on a first side of each respective opening 206 in each respective plane of the array, a second portion (e.g., side) of first conductive line material 302 on a second (e.g., opposite) side of each respective opening 206 in each respective plane of the array, and the portion of insulation material 303 at the bottom of each respective opening 206, as illustrated in FIGS. 3A-3C, but also such that storage element material 308 does not completely fill the openings 206.

After storage element material 308 has been conformally formed in openings 206, second conductive line material 310 can be formed on storage element material 308 and in (e.g., fill) the remaining portion of openings 206 such that second conductive line material 310 is in direct contact with and between the storage element material 308 previously formed on the opposite sides of each respective opening 206 in each respective plane of the array, and such that second conductive line material 310 is in an additional horizontally oriented plane vertically separated from (e.g., above) the other planes of the array by insulation material 304 and storage element material 308, as illustrated in FIGS. 3A-3C. As such, second conductive line material 310 may be shunted in a single (e.g., only one) direction (e.g., from top to bottom).

Second conductive line material 310 can comprise (e.g., be formed of) a metallic (or semi-metallic) material or a semiconductor material such as a doped polysilicon material, among others, which can be the same material as first conductive line material 302, for instance. However, other metallic, semi-metallic, or semiconductor materials can be used. Further, the second conductive line material 310 formed in each respective opening 206 can be a different (e.g., separate) access line (e.g., word line) of the array.

The storage element material 308 can be a chalcogenide material, such as a chalcogenide alloy and/or glass, that can serve as a self-selecting storage element material (e.g., that can serve as both a select device and a storage element). For example, storage element material 308 (e.g., the chalcogenide material) can be responsive to an applied voltage, such as a program pulse, applied thereto. For an applied voltage that is less than a threshold voltage, storage element material 308 may remain in an "off" state (e.g., an electrically nonconductive state). Alternatively, responsive to an applied voltage that is greater than the threshold voltage, storage element material 308 may enter an "on" state (e.g., an electrically conductive state). Further, the threshold voltage of storage element material 308 in a given polarity may change based on the polarity (e.g., positive or negative) of the applied voltage. For instance, the threshold voltage may change based on whether the program pulse is positive or negative.

Examples of chalcogenide materials that can serve as storage element material 308 include indium(In)-antimony (Sb)-tellurium(Te) (IST) materials, such as $In_2Sb_2Te_5$, $In_1Sb_2Te_4$, $In_1Sb_4Te_7$, etc., and germanium(Ge)-antimony (Sb)-tellurium(Te) (GST) materials, such as $Ge_8Sb_5Te_8$, $Ge_2Sb_2Te_5$, $Ge_1Sb_2Te_4$, $Ge_1Sb_4Te_7$, $Ge_4Sb_4Te_7$, or etc., among other chalcogenide materials, including, for instance, alloys that do not change phase during the operation (e.g., selenium-based chalcogenide alloys). Further, the chalcogenide material may include minor concentrations of other dopant materials. The hyphenated chemical composition notation, as used herein, indicates the elements included in a particular mixture or compound, and is intended to represent all stoichiometries involving the indicated elements.

In an embodiment, storage element material 308 may be a resistive memory element (e.g., a phase change material) that may not be capable of serving as a self-selecting storage element material. In such an embodiment, an additional (e.g., separate) material that can serve as the select device (not shown in FIGS. 3A-3C) can be formed on storage element material 308 and in openings 206 before second conductive line material 310 is formed.

Further, although not shown in FIGS. 3A-3C for clarity and so as not to obscure embodiments of the present disclosure, other materials may be formed before, after, and/or between storage element material 308 and second conductive line material 310, for example to form adhesion layers or barriers against interdiffusion of materials and/or to mitigate composition mixing.

Figure 4A:
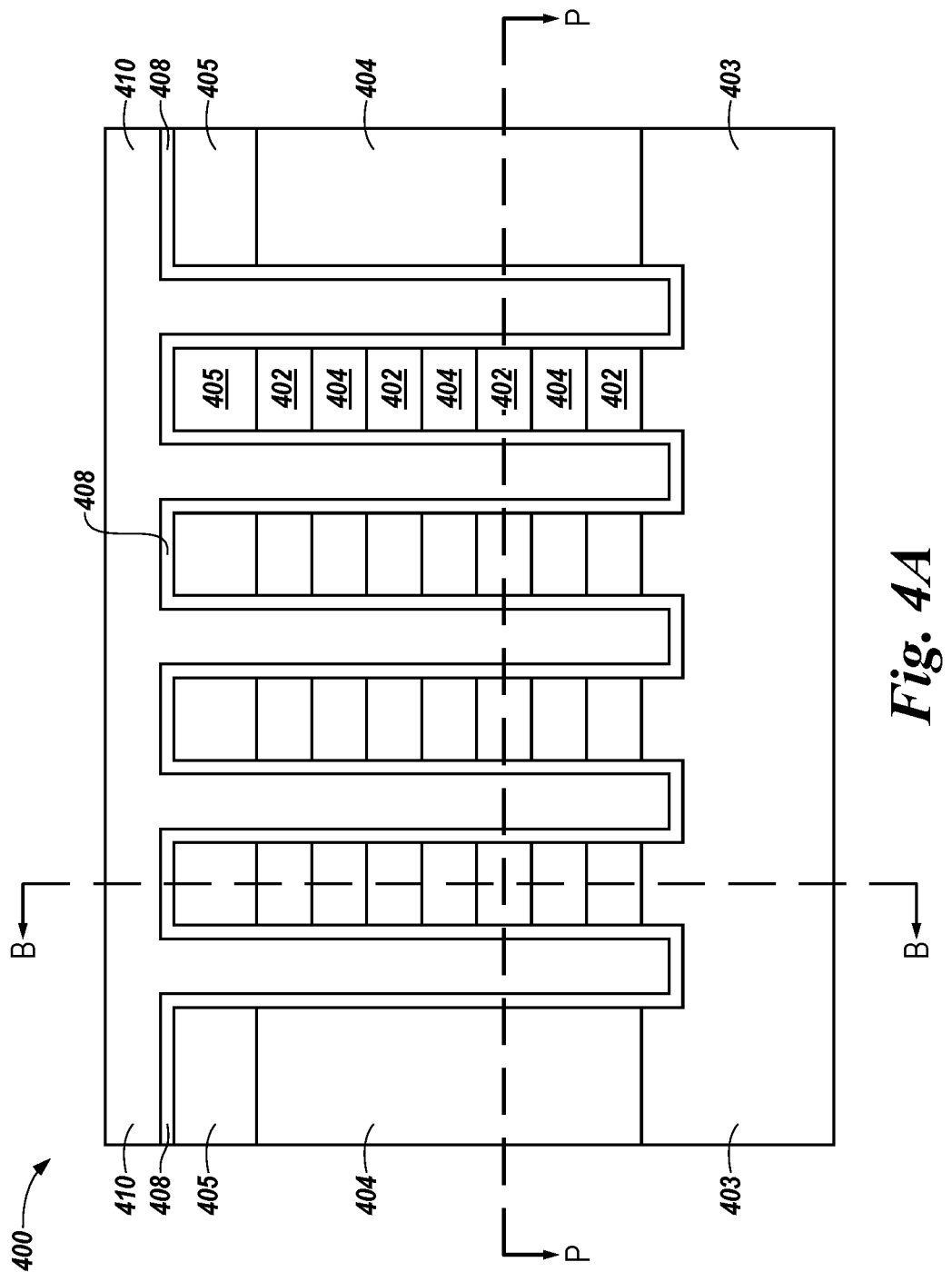
FIGS. 4A-4C illustrate various views of a subsequent processing step associated with forming the three dimensional memory array in accordance with an embodiment of the present disclosure.
Figure 4B:
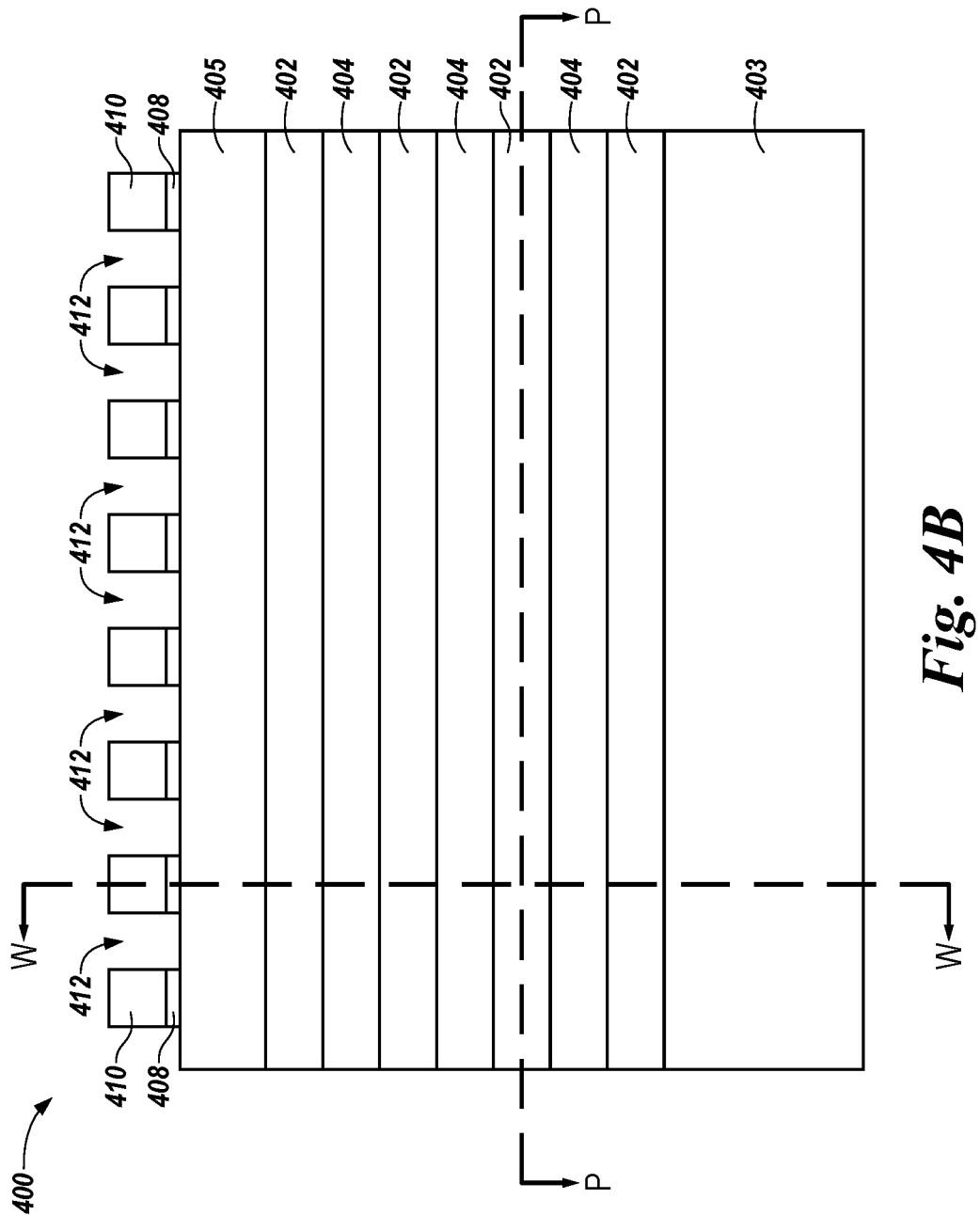
Figure 4C:
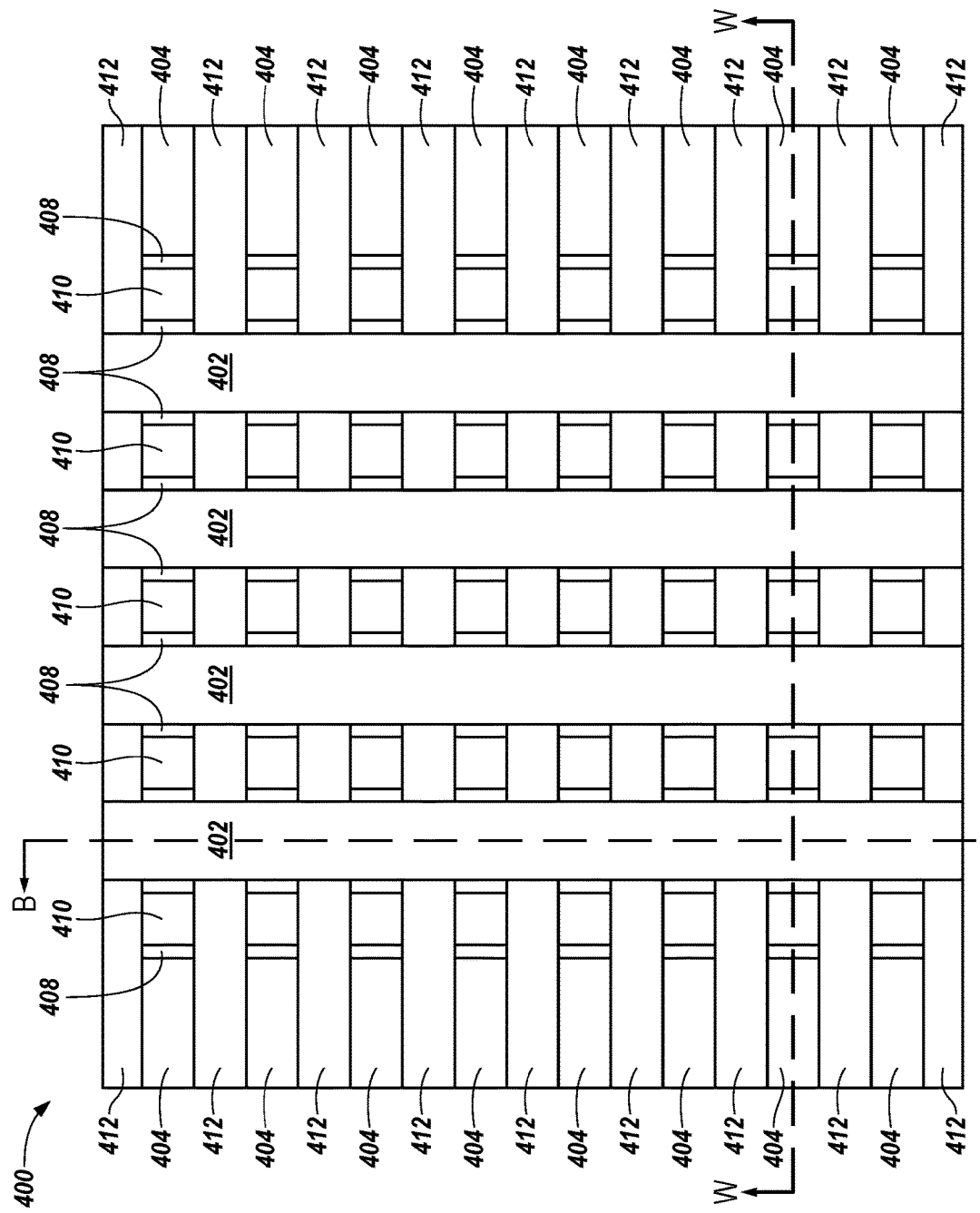

FIGS. 4A-4C illustrate various views of a subsequent processing step associated with forming the three dimensional memory array (referred to as 400 in FIGS. 4A-4C) in accordance with an embodiment of the present disclosure. For example, FIG. 4A illustrates a schematic cross-sectional view, along cut line W-W shown in FIGS. 4B and 4C, of the structure shown in FIGS. 3A-3C after the subsequent processing step. Further, FIG. 4B illustrates a schematic cross-sectional view, along cut line B-B shown in FIGS. 4A and 4C, of the structure shown in FIGS. 3A-3C after the subsequent processing step. Further, FIG. 4C illustrates a top view, along cut line P-P shown in FIGS. 4A and 4B, of the structure shown in FIGS. 3A-3C after the subsequent processing step.

As shown in FIGS. 4A-4C, a plurality of openings (e.g., vias or holes) 412 can be formed (e.g., etched and/or patterned) through second conductive line material 410, storage element material 408, insulation material 405, the alternating first conductive line material 402 and insulation material 404, and into insulation material 403, such that insulation material 403 forms the bottom of each respective opening 412, and second conductive line material 410, storage element material 408, insulation material 405, and the alternating first conductive line material 402 and insulation material 404 form the sidewalls of each respective opening 412. For example, the plurality of openings 412 can be formed through the second conductive line material 410 and storage element material 408 such that at least a portion of each respective opening 412 passes through the portion of second conductive line material 410 and storage element material 408 formed on insulation material 405 (e.g., through the additional horizontally oriented plane of the array that is above the other planes of the array), and through the alternating first conductive line material 402 and insulation material 404 such that at least a portion of each respective opening 412 passes through each respective first conductive line material 402 and insulation material 404 (e.g., through the other horizontal planes of the array), as illustrated in FIGS. 4A-4C.

By forming openings 412, portions of second conductive line material 410 can be removed such that the resulting area of second conductive line material 410 may exclude the area removed in forming openings 412. Further, as shown in FIGS. 4A-4C, the plurality of openings 412 can be formed in a direction that is substantially perpendicular to the first conductive line material 402, such that openings 412 are formed between each respective first conductive line material 402 in each respective horizontal plane. As such, openings 412 can be formed between, and therefore separate, second conductive line material 410 in a direction that is substantially perpendicular to first conductive line material 402, as illustrated in FIGS. 4A-4C.

Each of the plurality of openings 412 can be formed at the same time. For instance, each of the plurality of openings 412 can be formed in a single etch and/or pattern using a single mask. For example, the plurality of openings 412 can be formed by selectively etching exposed materials 410 and 408 through a stripe mask pattern (e.g., oriented so that the stripes exit the plane of FIG. 4B; not shown), in some embodiments.

As shown in FIGS. 4A-4C, different ones of openings 412 can be formed in different shapes and/or sizes. For example, in the embodiment illustrated in FIGS. 4A-4C, the openings 412 that are formed adjacent (e.g., along) the sides of array 400 can be rectangular shaped, and the openings 412 formed between the conductive line material 402 can be square shaped. However, embodiments of the present disclosure are not limited to a particular shape(s) and/or size(s) for openings 412. For example, circular, oval, and/or angled shaped openings, among others, may be formed, with sharp or rounded corners.

Figure 5A:
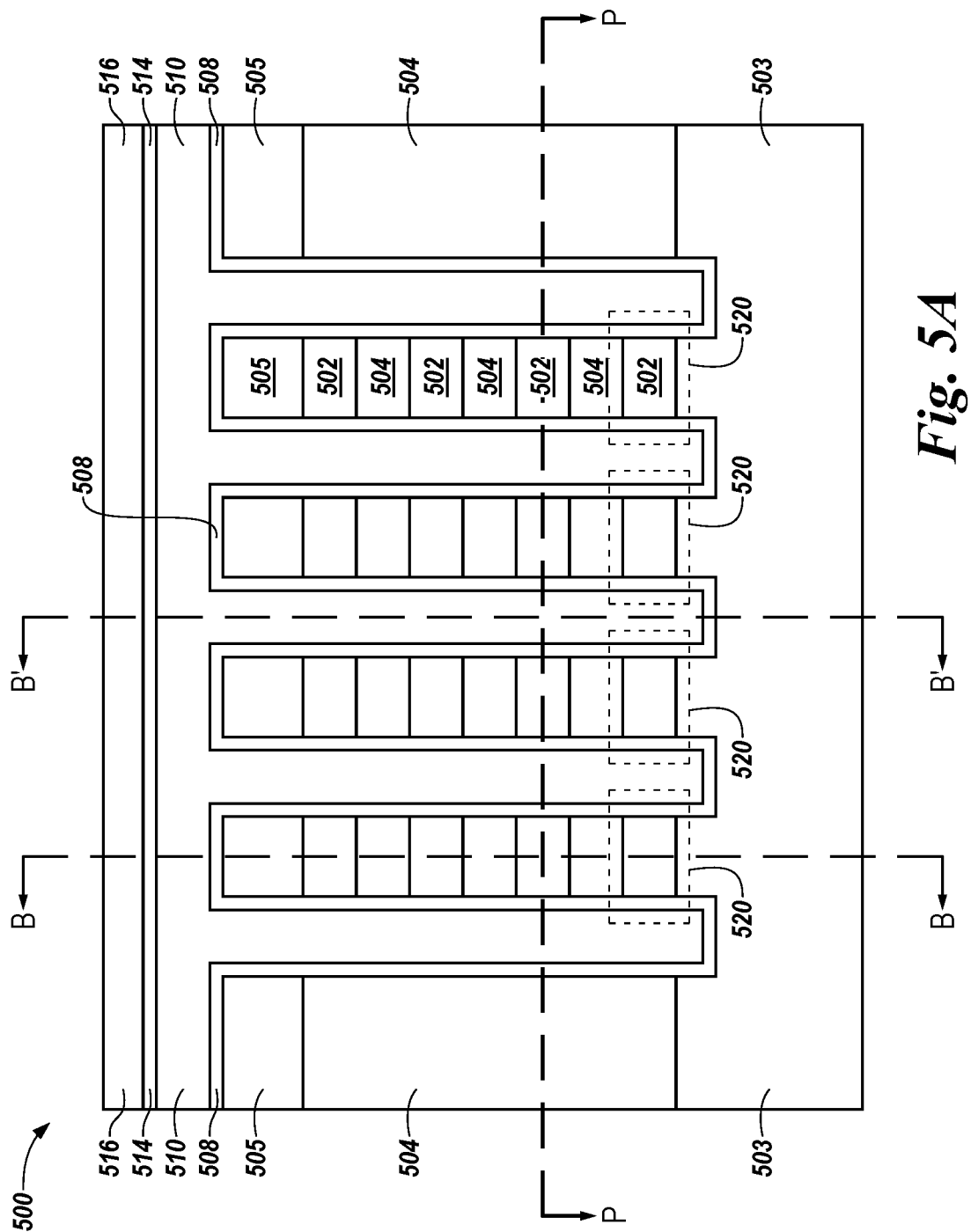
Figure 5B:
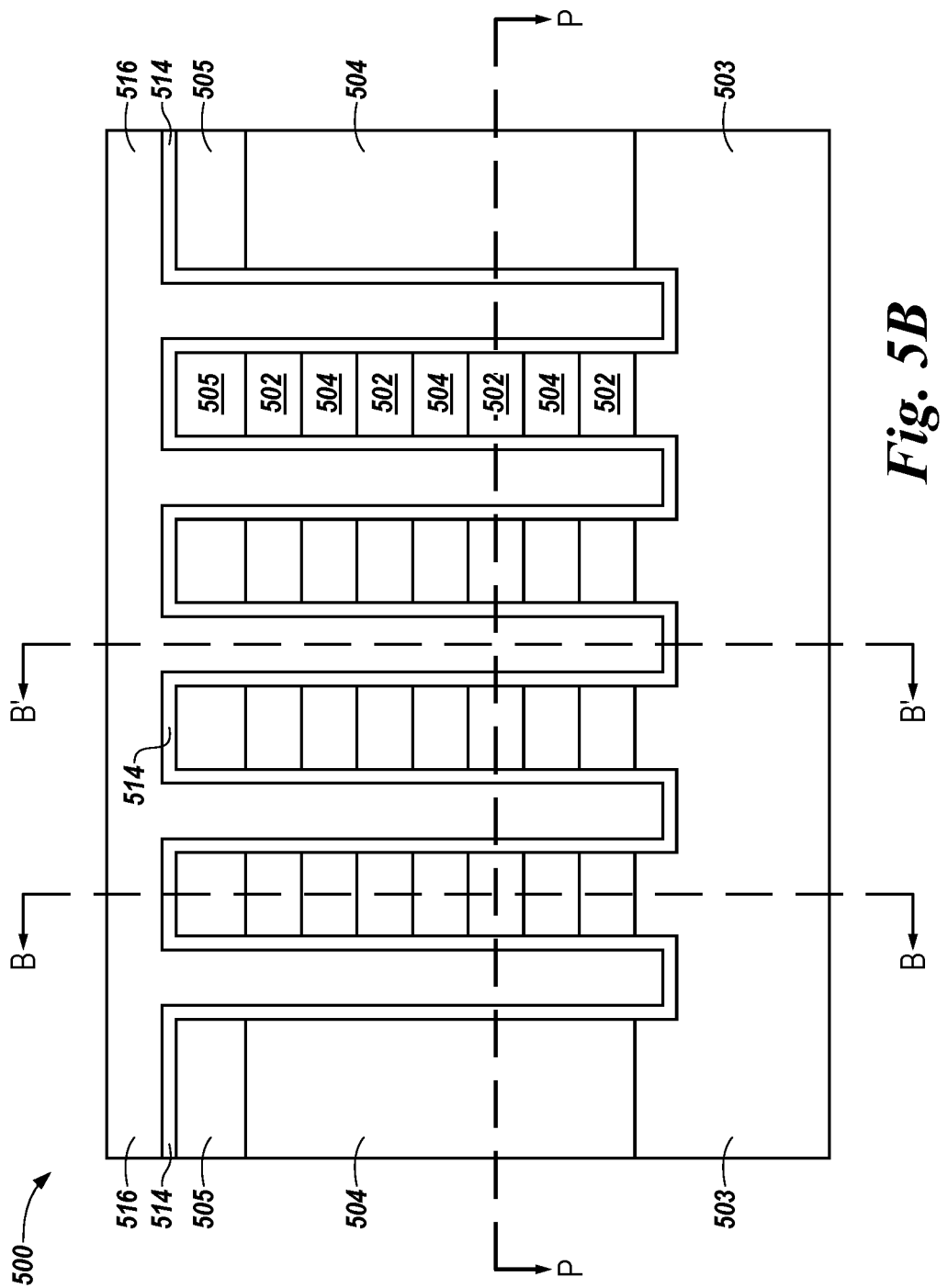
Figure 5C:
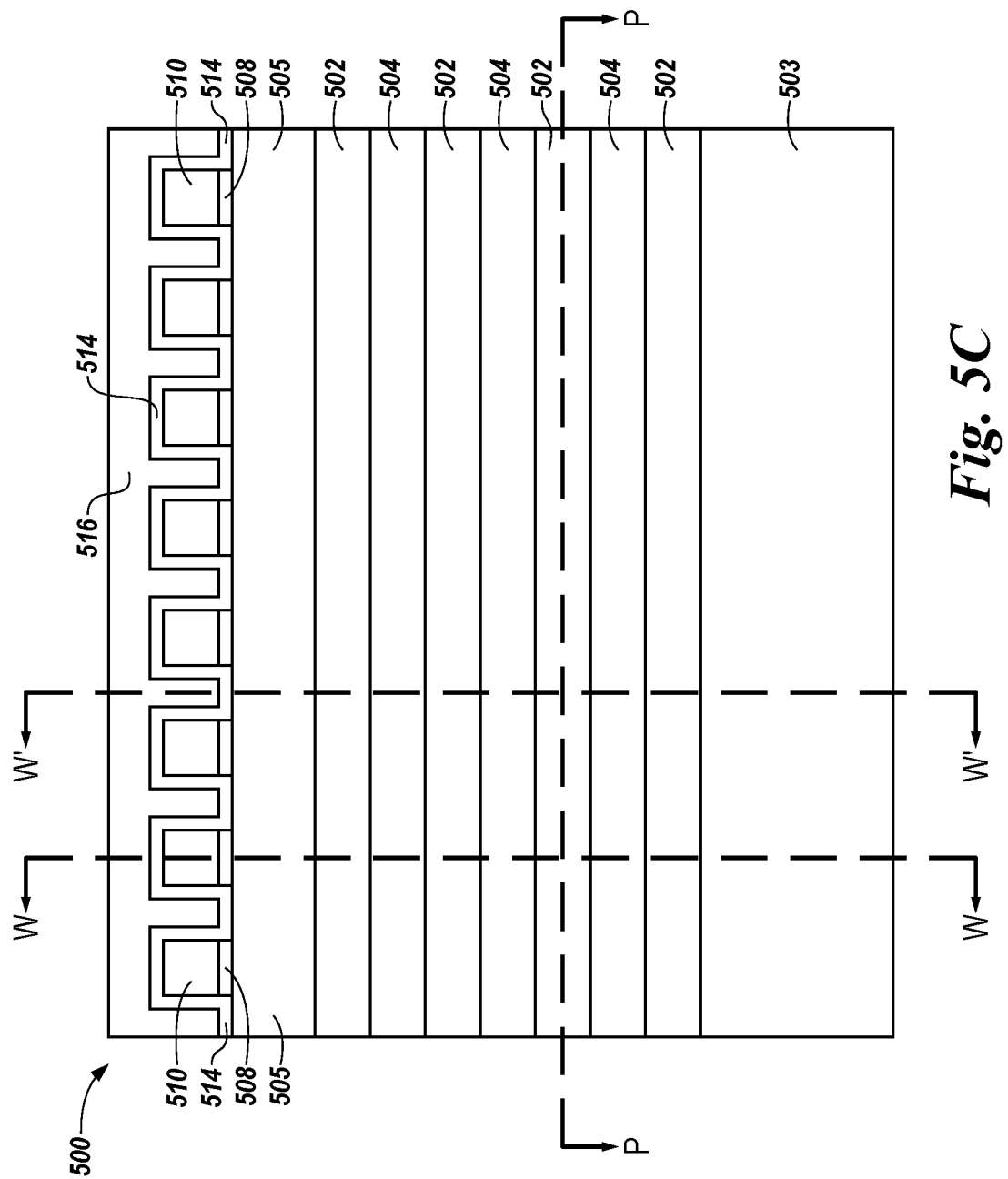
Figure 5D:
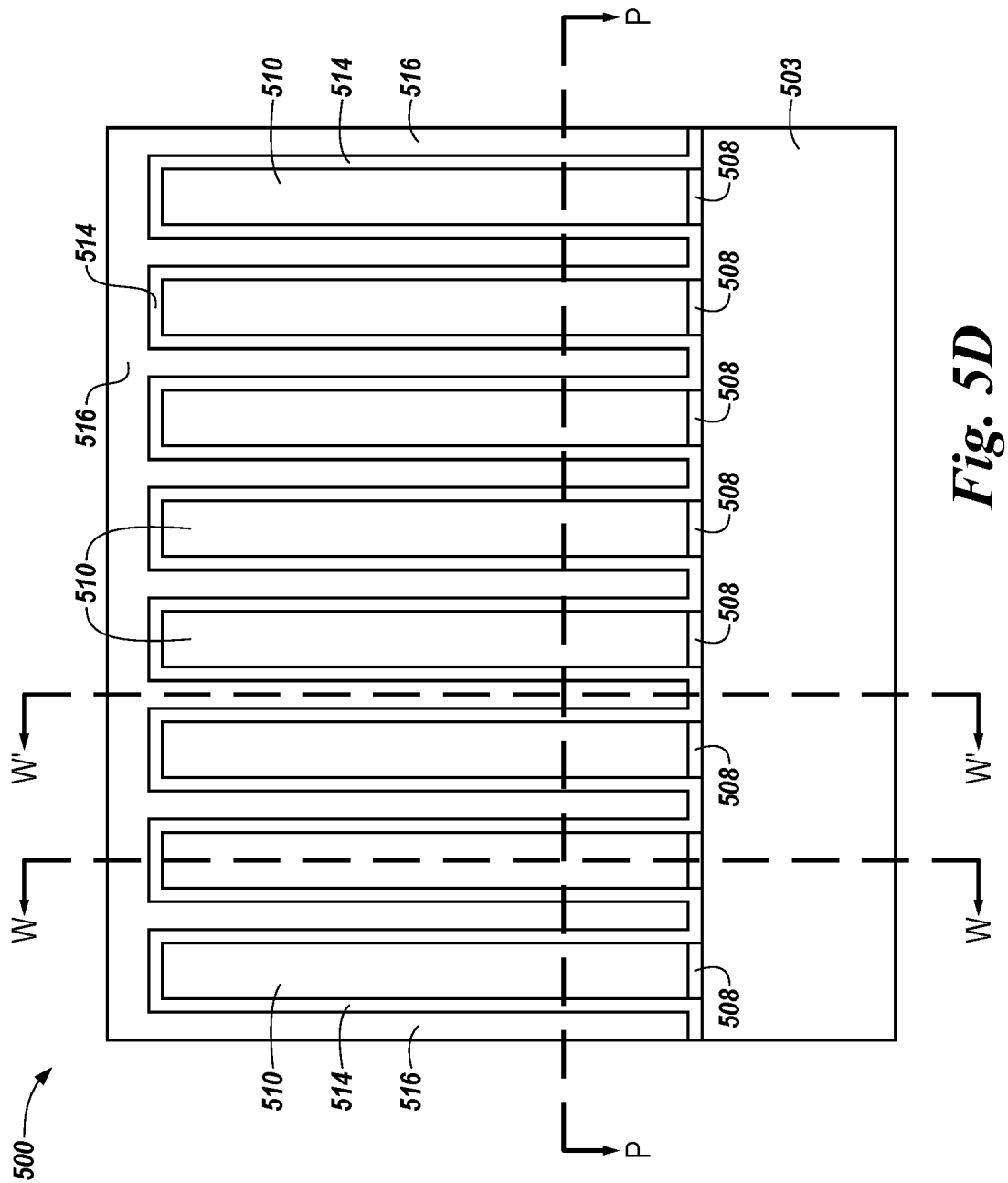

FIGS. 5A-5E illustrate various views of a subsequent processing step associated with forming the three dimensional memory array (referred to as 500 in FIGS. 5A-5E) in accordance with an embodiment of the present disclosure. For example, FIG. 5A illustrates a schematic cross-sectional view, along cut line W-W shown in FIGS. 5C-5E, of the structure shown in FIGS. 4A-4C after the subsequent processing step. Further, FIG. 5B illustrates a schematic cross-sectional view, along cut line W'-W' shown in FIGS. 5C-5E, of the structure shown in FIGS. 4A-4C after the subsequent processing step. Further, FIG. 5C illustrates a schematic cross-sectional view, along cut line B-B shown in FIGS. 5A-5B and 5E, of the structure shown in FIGS. 4A-4C after the subsequent processing step. Further, FIG. 5D illustrates a schematic cross-sectional view, along cut line B'-B' shown in FIGS. 5A-5B and 5E, of the structure shown in FIGS. 4A-4C after the subsequent processing step. Further, FIG. 5E illustrates a top view, along cut line P-P shown in FIGS. 5A-5D, of the structure shown in FIGS. 4A-4C after the subsequent processing step.

As shown in FIGS. 5A-5E, additional insulation materials 514 and 516 can be formed in (e.g., fill) the plurality of openings 412. For example, insulation material 514 can be formed on second conductive line material 510 and in openings 412 such that insulation material 514 is in direct contact with (e.g., seals) a first portion (e.g., side) of second conductive line material 510, storage element material 508, insulation material 505, and the alternating first conductive line material 502 and insulation material 504 on a first side of each respective opening 412, insulation material 514 is in direct contact with a second portion (e.g., side) of second conductive line material 510, storage element material 508, insulation material 505, and the alternating first conductive line material 502 and insulation material 504 on a second (e.g., opposite) side of each respective opening 412, and insulation material 514 is in direct contact with the portion of insulation material 503 at the bottom of each respective opening 412, as illustrated in FIGS. 5A-5E, but also such that insulation material 514 does not completely fill the openings 412.

After insulation material 514 has been formed in openings 412, insulation material 516 can be formed on insulation material 514 and in (e.g., fill) the remaining portion of openings 412 such that insulation material 516 is in direct contact with and between the insulation material 514 previously formed on the opposite sides of each respective opening 412, as illustrated in FIGS. 5A-5E.

Insulation materials 514 and 516 can be, for example, dielectric materials, such as, for instance, silicon oxide, silicon nitride, or silicon oxynitride. In an embodiment, insulation materials 514 and 516 can comprise the same dielectric material. In an additional embodiment, insulation materials 514 and 516 can each comprise different dielectric materials. Further, insulation materials 514 and 516 may comprise the same or different dielectric materials as insulation materials 503, 504, and/or 505.

As shown in FIGS. 5A-5E, the storage element material 508 and the second conductive line material 510 that were formed in each respective opening 206 are arranged to extend substantially perpendicular to the first conductive line material 502 formed in the plurality of horizontally oriented planes of array 500. In connection with FIGS. 5A-5E, the first and second conductive line materials can be referred to as conductive lines 502 and 510, respectively. For instance, the conductive line material formed in the plurality of horizontally oriented planes can comprise conductive lines 502 after the processing step illustrated in FIGS. 5A-5E is complete, and the conductive line material formed in each respective opening 206 can comprise conductive lines 510 after the processing step illustrated in FIGS. 5A-5E. Further, although not shown in FIGS. 5A-5E for clarity and so as not to obscure embodiments of the present disclosure, conductive lines 510 can include one or more materials, such as, for instance, adhesion layers or barriers, as previously described herein (e.g., in connection with FIGS. 3A-3C).

As such, the storage element material 508 and the conductive line 510 formed in each respective opening 206 can comprise a vertical stack of array 500. That is, array 500 can include a plurality of vertical stacks, wherein each respective stack includes a conductive line 510 arranged to extend substantially perpendicular to and pass through conductive lines 502 and insulation material 504, and a storage element material 508 formed between conductive lines 502 and conductive line 510 where conductive line 510 passes through conductive lines 502 in the stack, as illustrated in FIGS. 5A-5E. The storage element material 508 of each respective stack may be between and in direct contact with a first portion (e.g., first side) of each respective conductive line 502 in the stack and a first portion (e.g., first side) of conductive line 510 in the stack, and the storage element material 508 may also be between and in direct contact with a second portion (e.g., the opposite side) of each respective conductive line 502 in the stack and a second portion (e.g., the opposite side) of conductive line 510 in the stack, as illustrated in FIGS. 5A-5E.

Further, in connection with FIGS. 5A-5E, the portion of second conductive line material 510 that extends substantially parallel to conductive lines 502 and is separated from conductive lines 502 by insulation material 505 (e.g., the portion of conductive line material 510 that is in the additional horizontally oriented plane of the array that is above conductive lines 502) can be referred to as a conductive extension. As shown in FIGS. 5A-5E, each respective conductive extension can be separated from one another by insulation materials 514 and 516, and can be communicatively coupled to the conductive line 510 of each vertical stack in a particular vertical plane of array 500. The conductive extensions can be used to select the conductive lines 510 of the vertical stacks during a program or sense operation performed on array 500, as will be further described herein (e.g., in connection with FIG. 12).

As shown in FIGS. 5A-5E, a plurality of memory cells 520 can be formed in each respective horizontal plane of array 500 formed by conductive lines 502. For instance, memory cells 520 can be formed substantially at the same levels as the data (e.g., bit) lines of array 500 are formed, such that a memory cell is substantially co-planar with the conductive line 502 that comprises that cell.

For example, as illustrated in FIGS. 5A-5E, each respective memory cell 520 can comprise a first portion and a second portion (e.g., opposite sides) of a conductive line 502, a portion of a first conductive line 510, a portion of a second conductive line 510, a first portion of storage element material 508, and a second portion of storage element material 508. The first portion of storage element material 508 may be between and in direct contact with the first portion of the conductive line 502 of that cell and the portion of the first conductive line 510 of that cell, and the second portion of storage element material 509 may be between and in direct contact with the second portion of the conductive line 502 of that cell and the portion of the second conductive line 510 of that cell, as shown in FIGS. 5A-5E.

Further, each respective memory cell 520 can comprise portions of insulation materials 503, 504, and/or 505. For instance, each respective memory cell can comprise a portion of the insulation material 503 or 504 in direct contact with a third portion (e.g., the bottom) of the conductive line 502 of that cell, and a portion of the insulation material 504 or 505 in direct contact with a fourth portion (e.g., the top) of the conductive line 502 of that cell, as illustrated in FIGS. 5A-5E.

Further, each respective memory cell 520 can comprise portions of insulation materials 514 and 516. For instance, each respective memory cell can comprise portions of insulation material 514 that are in direct contact with the conductive line 502, first and second conductive lines 510, and storage element material 508 of that cell, and portions of insulation material 516 that are in direct contact with the insulation material 514 of that cell, as illustrated in FIGS. 5A-5E.

Figure 6:
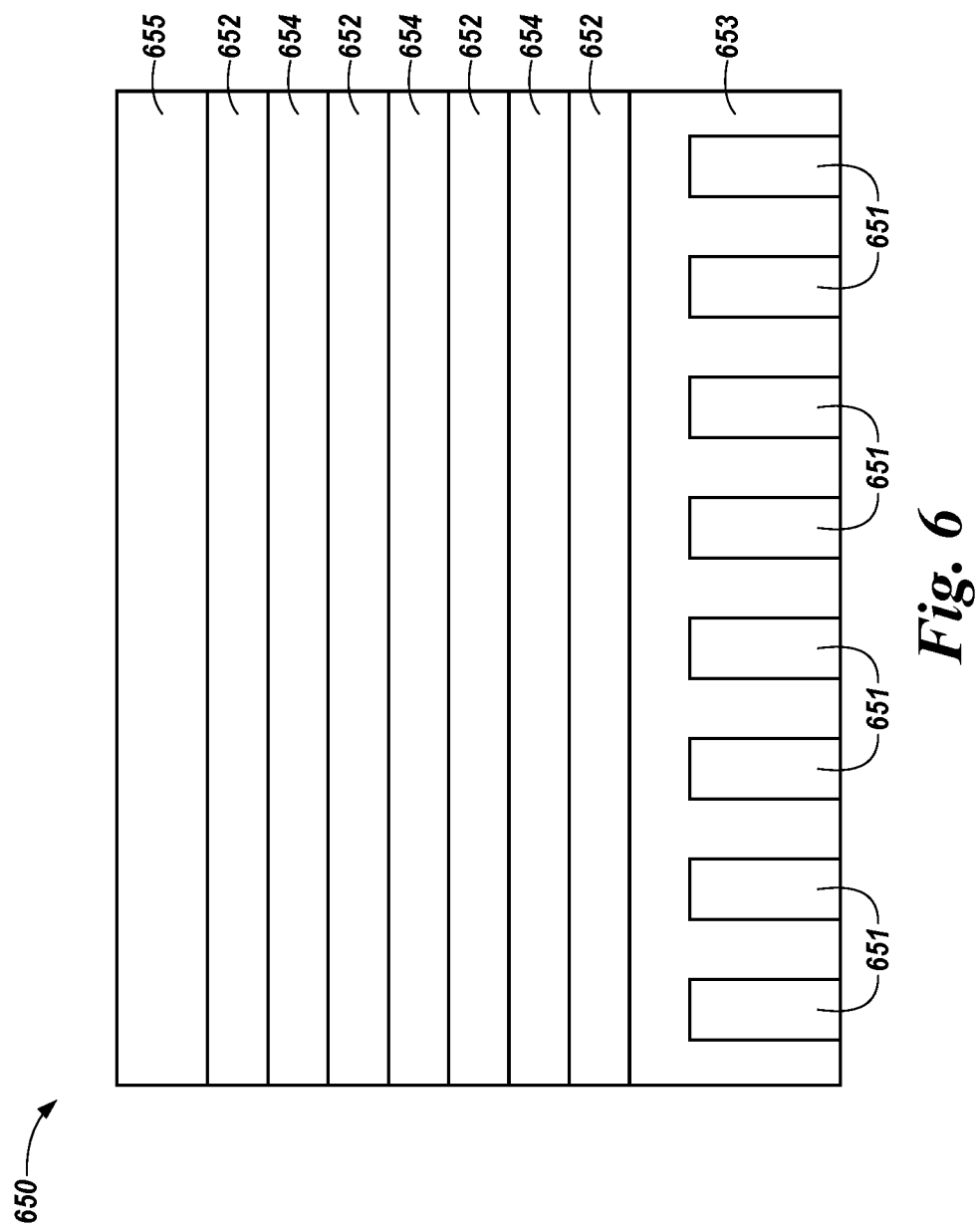
FIG. 6 illustrates a view of a processing step associated with forming a three dimensional memory array in accordance with an embodiment of the present disclosure.

FIG. 6 illustrates a view of a processing step associated with forming a three dimensional memory array (referred to as 650 in FIG. 6) in accordance with an embodiment of the present disclosure. For example, FIG. 6 illustrates a schematic cross-sectional view of the processing step.

FIG. 6 shows the formation (e.g., deposition) of a conductive line material 652 in a plurality of horizontally oriented planes vertically separated from one other by an insulation material 654, in a manner analogous to conductive line material 102 and insulation material 104 previously described in connection with FIG. 1. For instance, the first conductive line material 652 can be formed over an insulation material (e.g., substrate) 653, and an insulation material 655 can be formed on the last (e.g., top) conductive line material 652, as illustrated in FIG. 6. Conductive line material 652 and insulation materials 654, 653, and 655 can be and/or comprise materials analogous to conductive line material 102 and insulation materials 104, 103, and 105, respectively, previously described in connection with FIG. 1.

In the example illustrated in FIG. 6, a plurality of conductive plugs 651 can be formed (e.g., built) in insulation material 653, such that the conductive plugs 651 are separated from each other, and from conductive line material 652 (e.g., from the first conductive line material formed over insulation material 653), by insulation material 653. The conductive plugs 651 can comprise copper, tungsten, and/or aluminum, and/or other conductive materials and/or combinations thereof, and can be coupled to an access device underneath located underneath array 650 (e.g., below insulation material 653). Although eight such plugs are shown in the embodiment illustrated in FIG. 6, embodiments of the present disclosure are not limited to this quantity.

Figure 7A:
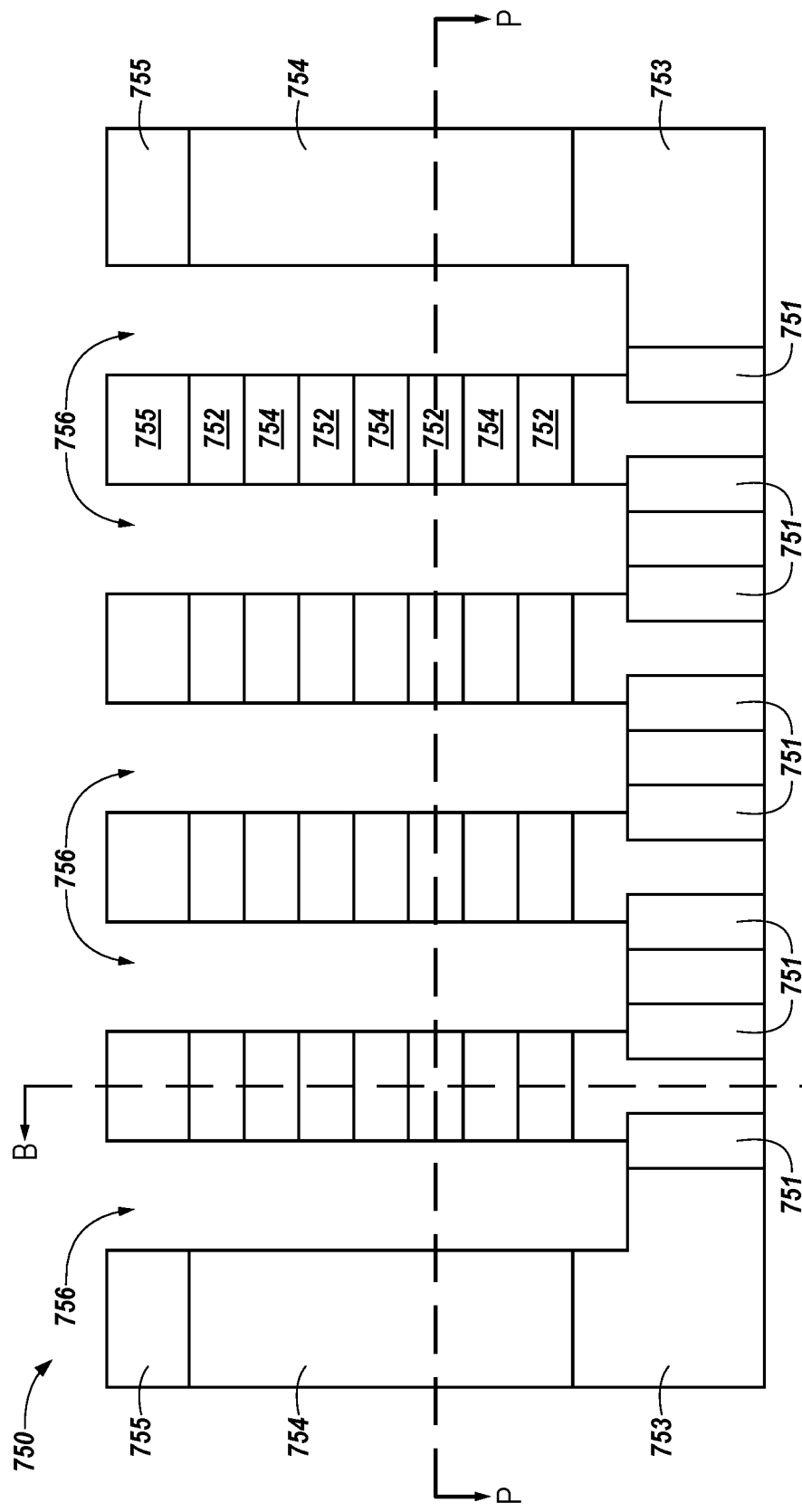
FIGS. 7A-7C illustrate various views of a subsequent processing step associated with forming the three dimensional memory array in accordance with an embodiment of the present disclosure.
Figure 7B:
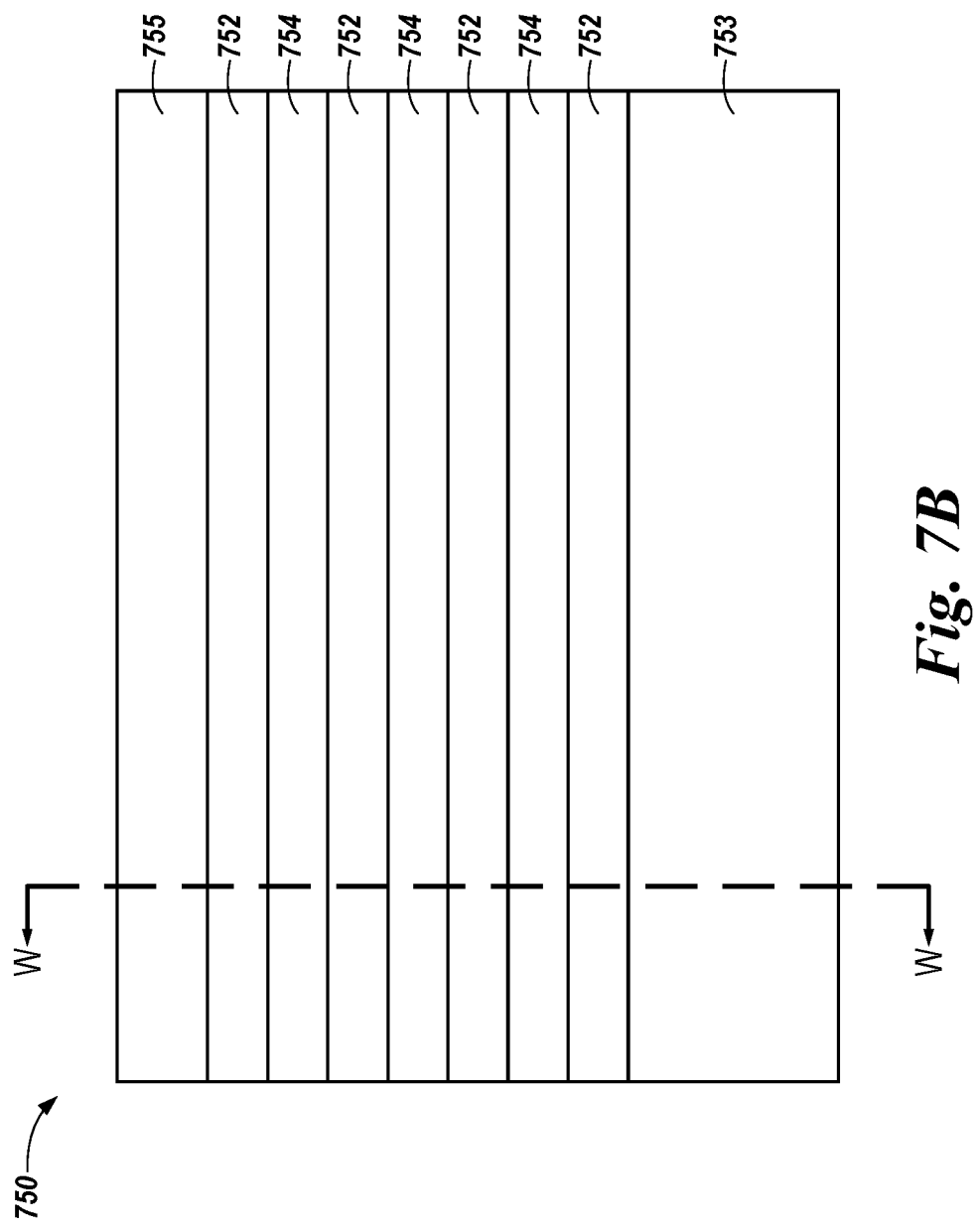
Figure 7C:
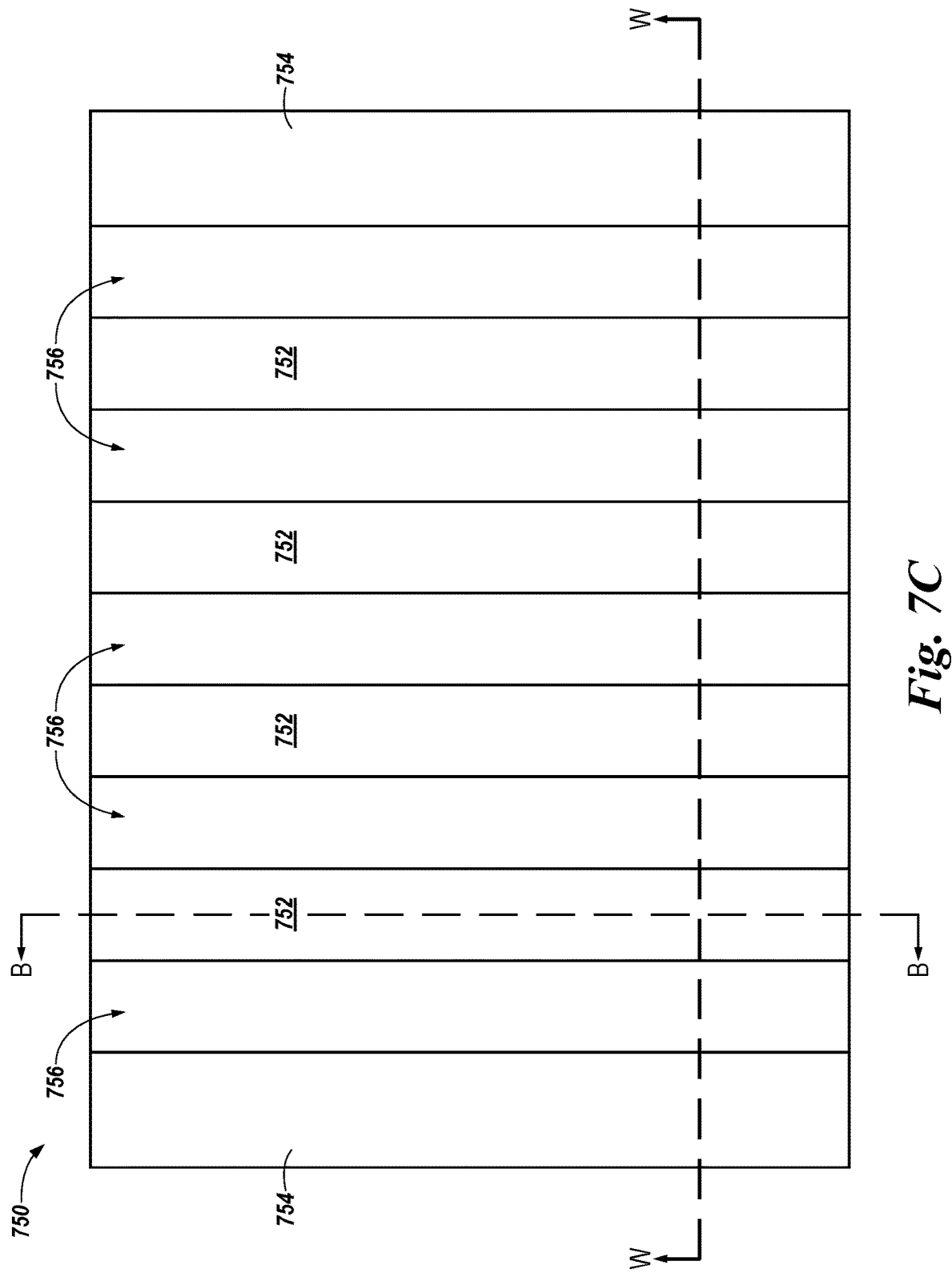

FIGS. 7A-7C illustrate various views of a subsequent processing step associated with forming the three dimensional memory array (referred to as 650 in FIGS. 7A-7C) in accordance with an embodiment of the present disclosure. For example, FIG. 7A illustrates a schematic cross-sectional view, along cut line W-W shown in FIGS. 7B and 7C, of the structure shown in FIG. 6 after the subsequent processing step. Further, FIG. 7B illustrates a schematic cross-sectional view, along cut line B-B shown in FIGS. 7A and 7C, of the structure shown in FIG. 6 after the subsequent processing step. Further, FIG. 7C illustrates a top view, along cut line P-P shown in FIGS. 7A and 7B, of the structure shown in FIG. 6 after the subsequent processing step.

As shown in FIGS. 7A-7C, a plurality of openings (e.g., vias or holes) 756 can be formed (e.g., etched and/or patterned) through insulation material 755, the alternating conductive line material 752 and insulation material 754, and into insulation material 753, in a manner analogous to openings 206 previously described in connection with FIGS. 2A-2C. For instance, openings 756 can be formed such that insulation material 755 and the alternating conductive line material 752 and insulation material 754 form the sidewalls of each respective opening, as illustrated in FIGS. 7A-7C. Further, openings 756 can be formed such that the bottom of each respective opening 756 is formed by a portion of insulation material 753, and by a portion of one or two of the conductive plugs 751, as illustrated in FIGS. 7A-7C.

Figure 8A:
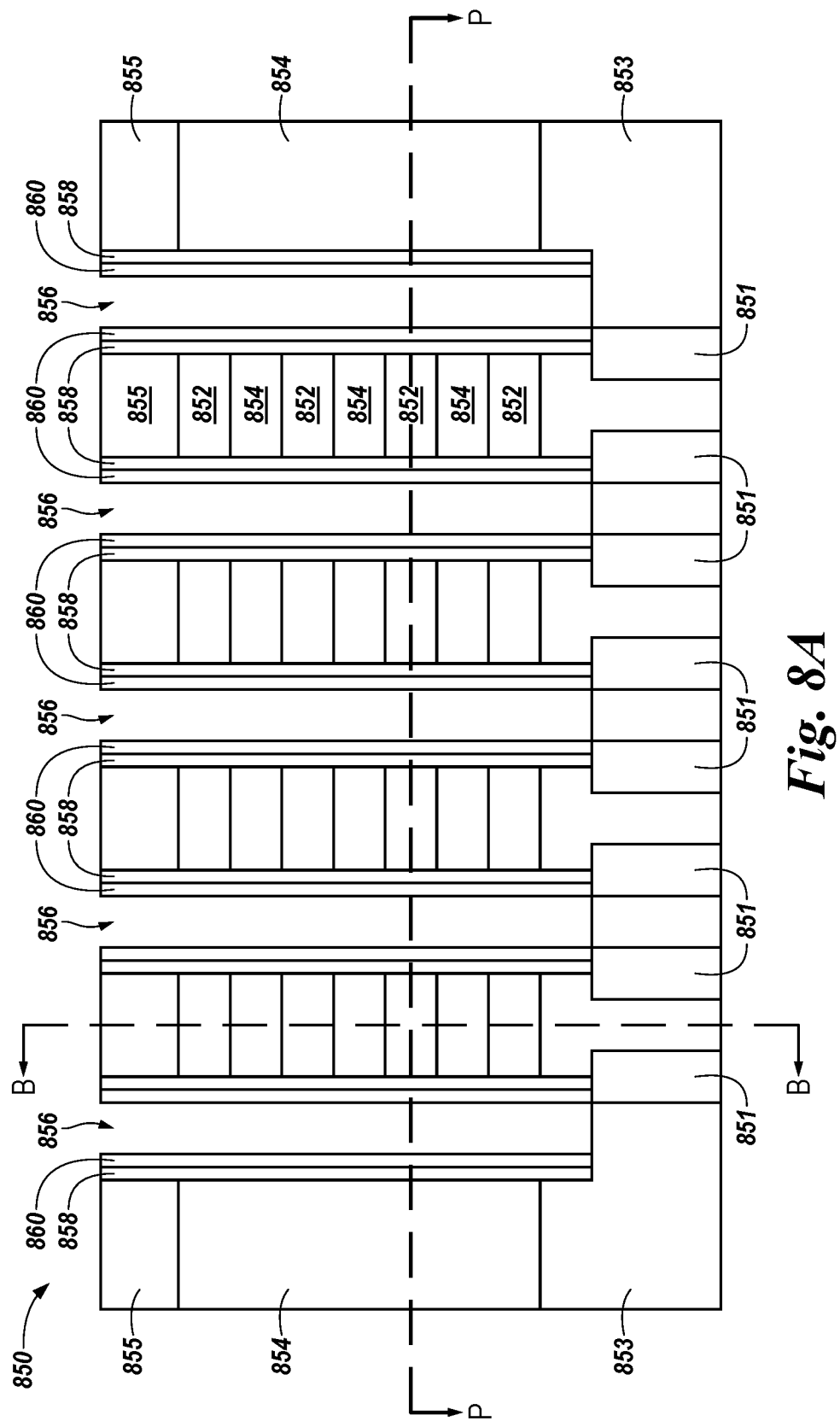
Figure 8C:
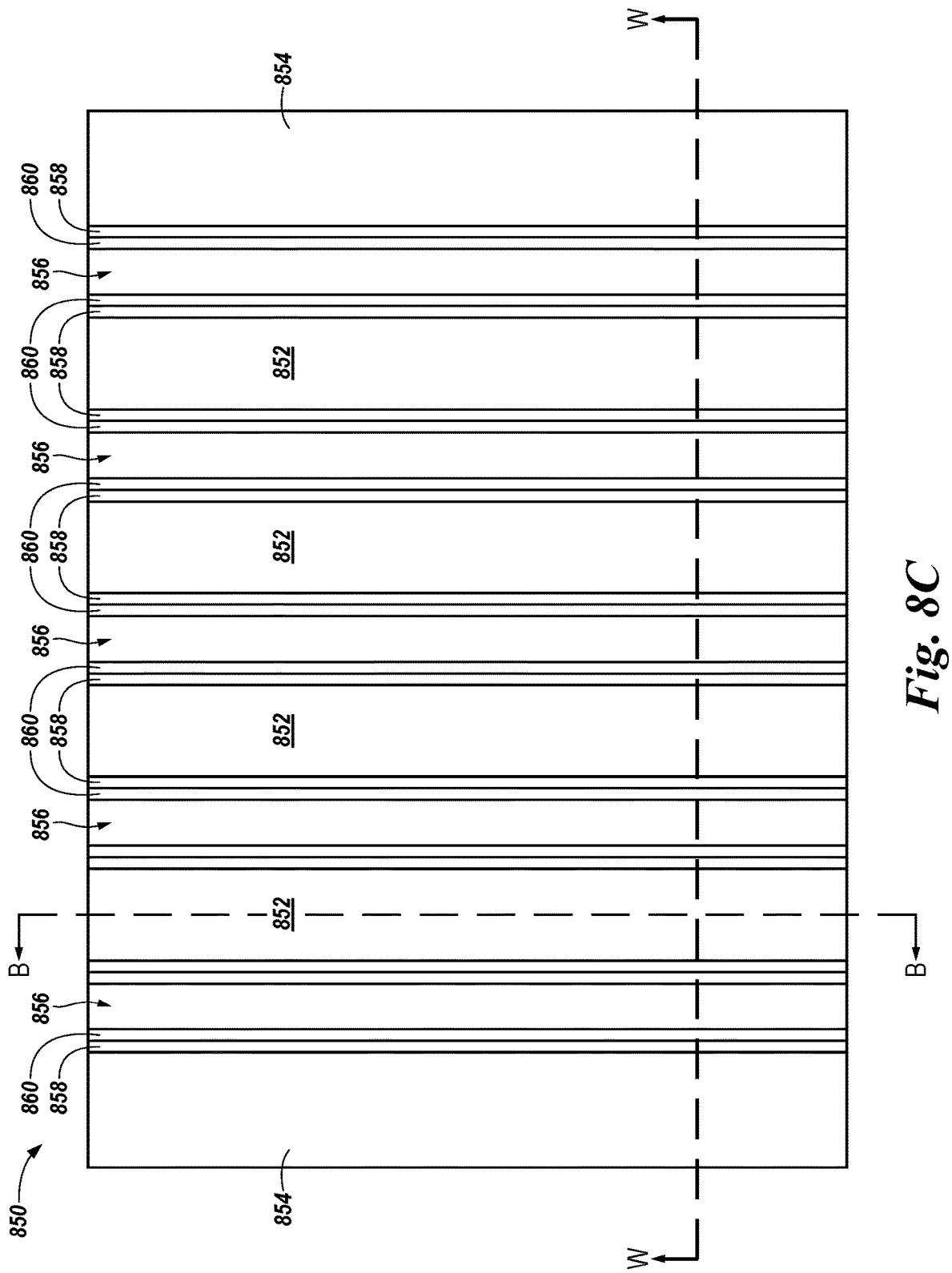

FIGS. 8A-8C illustrate various views of a subsequent processing step associated with forming the three dimensional memory array (referred to as 850 in FIGS. 8A-8C) in accordance with an embodiment of the present disclosure. For example, FIG. 8A illustrates a schematic cross-sectional view, along cut line W-W shown in FIGS. 8B and 8C, of the structure shown in FIGS. 7A-7C after the subsequent processing step. Further, FIG. 8B illustrates a schematic cross-sectional view, along cut line B-B shown in FIGS. 8A and 8C, of the structure shown in FIGS. 7A-7C after the subsequent processing step. Further, FIG. 8C illustrates a top view, along cut line P-P shown in FIGS. 8A and 8B, of the structure shown in FIGS. 7A-7C after the subsequent processing step.

As shown in FIGS. 8A-8C, a storage element material 858 and an additional (e.g., second) conductive line material 860 can be formed in, but not completely fill, the plurality of openings 856. Storage element material 858 and conductive line material 850 can be and/or comprise materials analogous to storage element material 308 and conductive line material 310, respectively, previously described in connection with FIGS. 3A-3C.

As an example, storage element material 858 can be conformally formed (e.g., conformally deposited) on insulation material 855 and in openings 856, in a manner analogous to storage element material 308 previously described in connection with FIGS. 3A-3C. Portions of storage element material 858 formed on insulation material 855 and across the bottom of each opening 856 can then be removed (e.g., etched and/or patterned), as illustrated in FIGS. 8A-8C.

Second conductive line material 860 can then be formed in the remaining portion of openings 856 such that second conductive line material 860 is in direct contact with and between the storage element material 858 previously formed on the opposite sides of each respective opening 856 in each respective plane of the array, but does not completely fill the openings, as illustrated in FIGS. 8A-8C. For instance, after second conductive line material 860 is formed in openings 856, a portion of the second conductive line material 860 in and across the bottom of each respective opening can be removed (e.g., etched and/or patterned), such that second conductive line material 860 is in direct contact with the storage element material 858 on both sides of each respective opening 856 in each respective plane of the array, but a portion of each respective opening 856 remains between (e.g., separates) the second conductive material 860 on each respective side of the opening, as illustrated in FIGS. 8A-8C.

Further, the storage element material 858 and second conductive line material 860 formed on each respective side of each respective opening 856 may be in direct contact with the portion of the conductive plug or plugs 851 that form the bottom of the opening, as illustrated in FIGS. 8A-8C. For instance, the storage element material 858 and second conductive line material 860 formed on one side of each respective opening 856 may be in direct contact with the portion of the conductive plug that forms the bottom of the opening on that side, and, if a portion of one of the other conductive plugs forms the bottom of the opening on the other side, the storage element material 858 and second conductive line material 860 formed on the other side of the opening may be in direct contact with the portion of that conductive plug on that side, as illustrated in FIGS. 8A-8C.

Figure 9A:
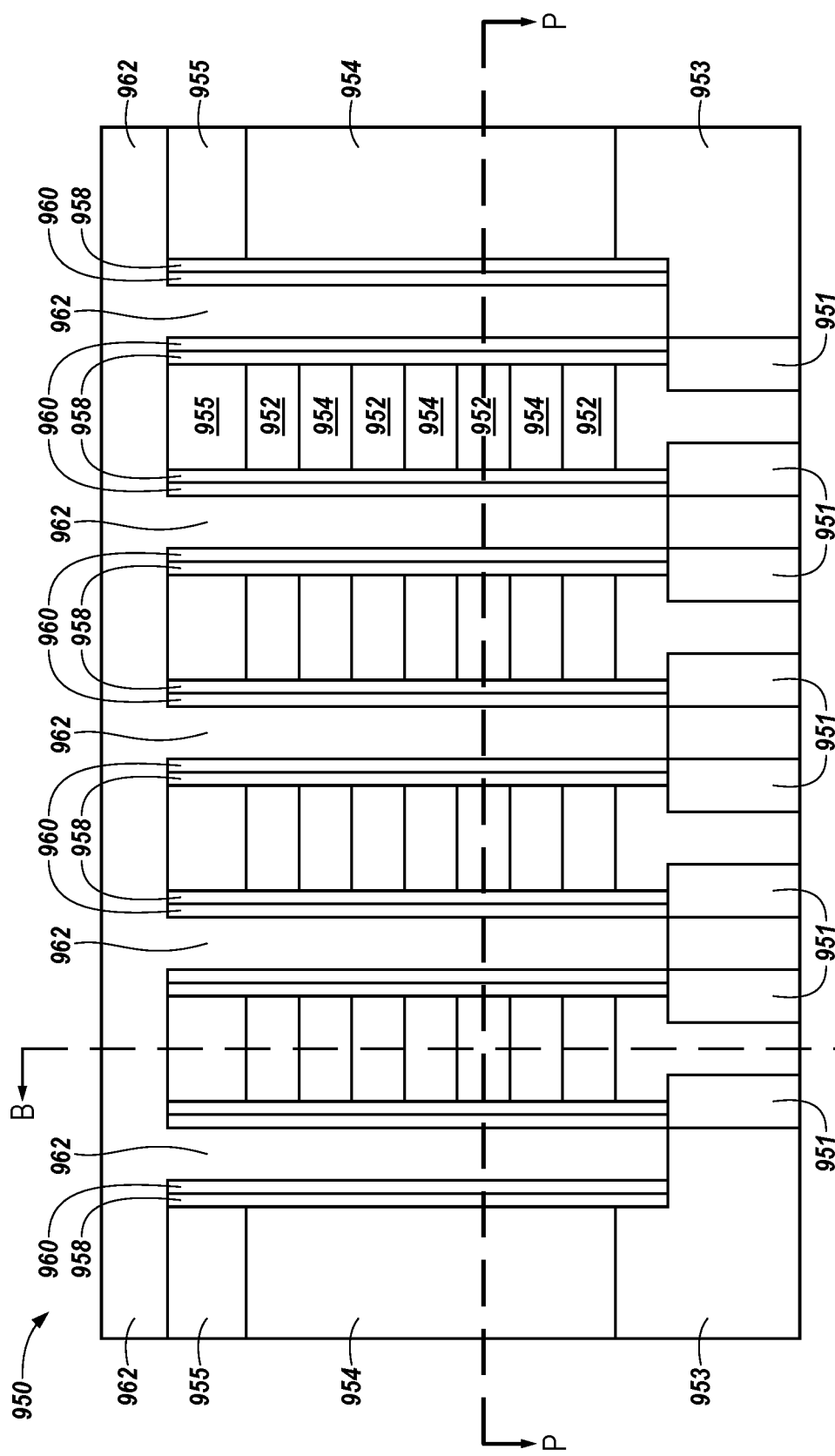
Figure 9C:
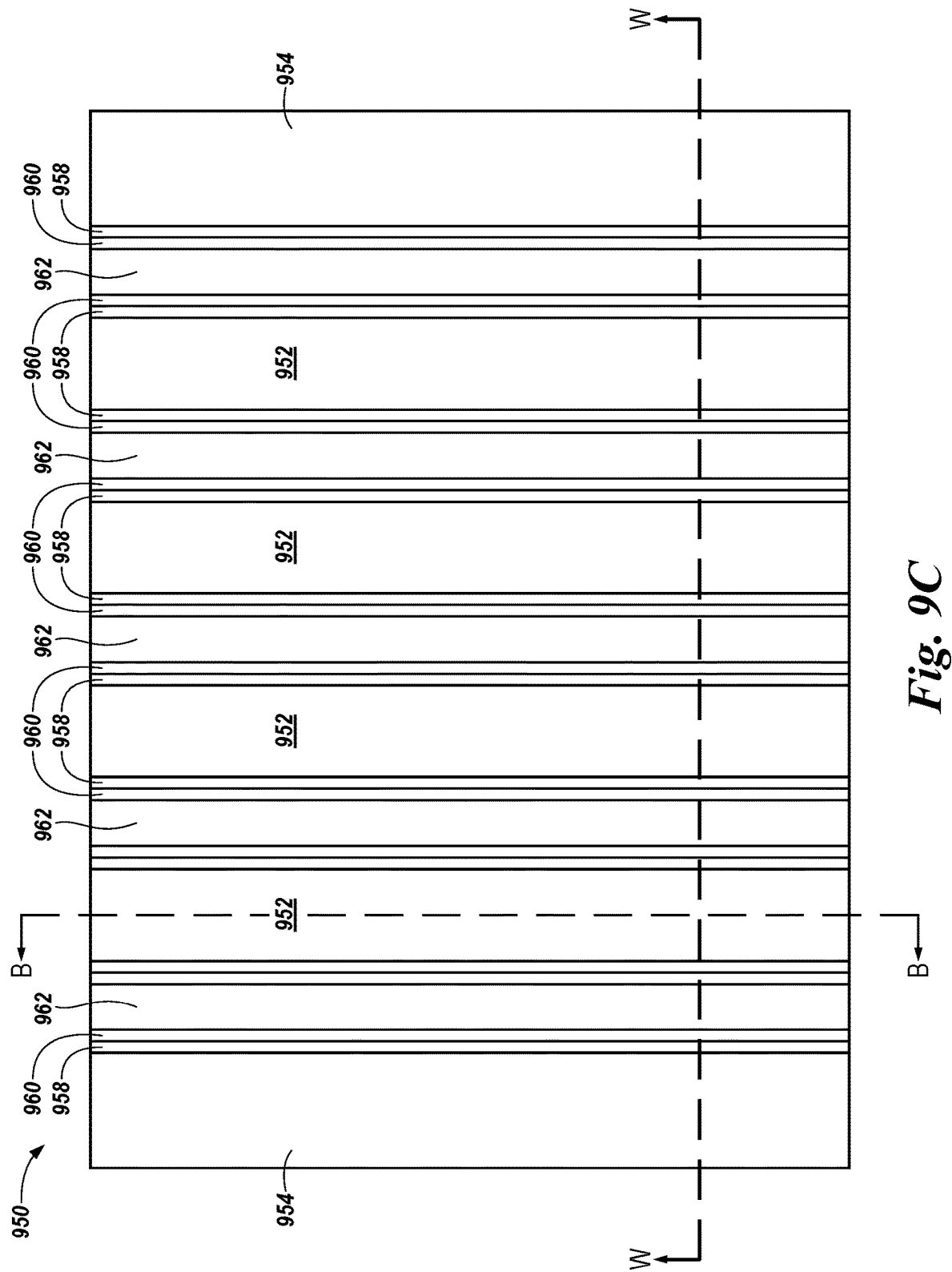

FIGS. 9A-9C illustrate various views of a subsequent processing step associated with forming the three dimensional memory array (referred to as 950 in FIGS. 9A-9C) in accordance with an embodiment of the present disclosure. For example, FIG. 9A illustrates a schematic cross-sectional view, along cut line W-W shown in FIGS. 9B and 9C, of the structure shown in FIGS. 8A-8C after the subsequent processing step. Further, FIG. 9B illustrates a schematic cross-sectional view, along cut line B-B shown in FIGS. 9A and 9C, of the structure shown in FIGS. 8A-8C after the subsequent processing step. Further, FIG. 9C illustrates a top view, along cut line P-P shown in FIGS. 9A and 9B, of the structure shown in FIGS. 8A-8C after the subsequent processing step.

As shown in FIGS. 9A-9C, an insulation material 962 can be formed in (e.g., fill) the remaining portion of openings 856. For example, insulation material 962 can be formed on insulation material 955 and in the remaining portion of openings 856 such that insulation material 962 is in direct contact with and between the second conductive line material 960 previously formed on the opposite sides of each respective opening 856 in each respective plane of the array, and such that insulation material 962 is in an additional horizontally oriented plane vertically separated from (e.g., above) the other planes of the array by insulation material 955, as illustrated in FIGS. 9A-9C.

Insulation material 962 can be, for example, a dielectric material, such as, for instance, silicon oxide, silicon nitride, or silicon oxynitride. Insulation materials 962 may comprise the same or different dielectric material as insulation materials 953, 954, and/or 955.

Figure 10A:
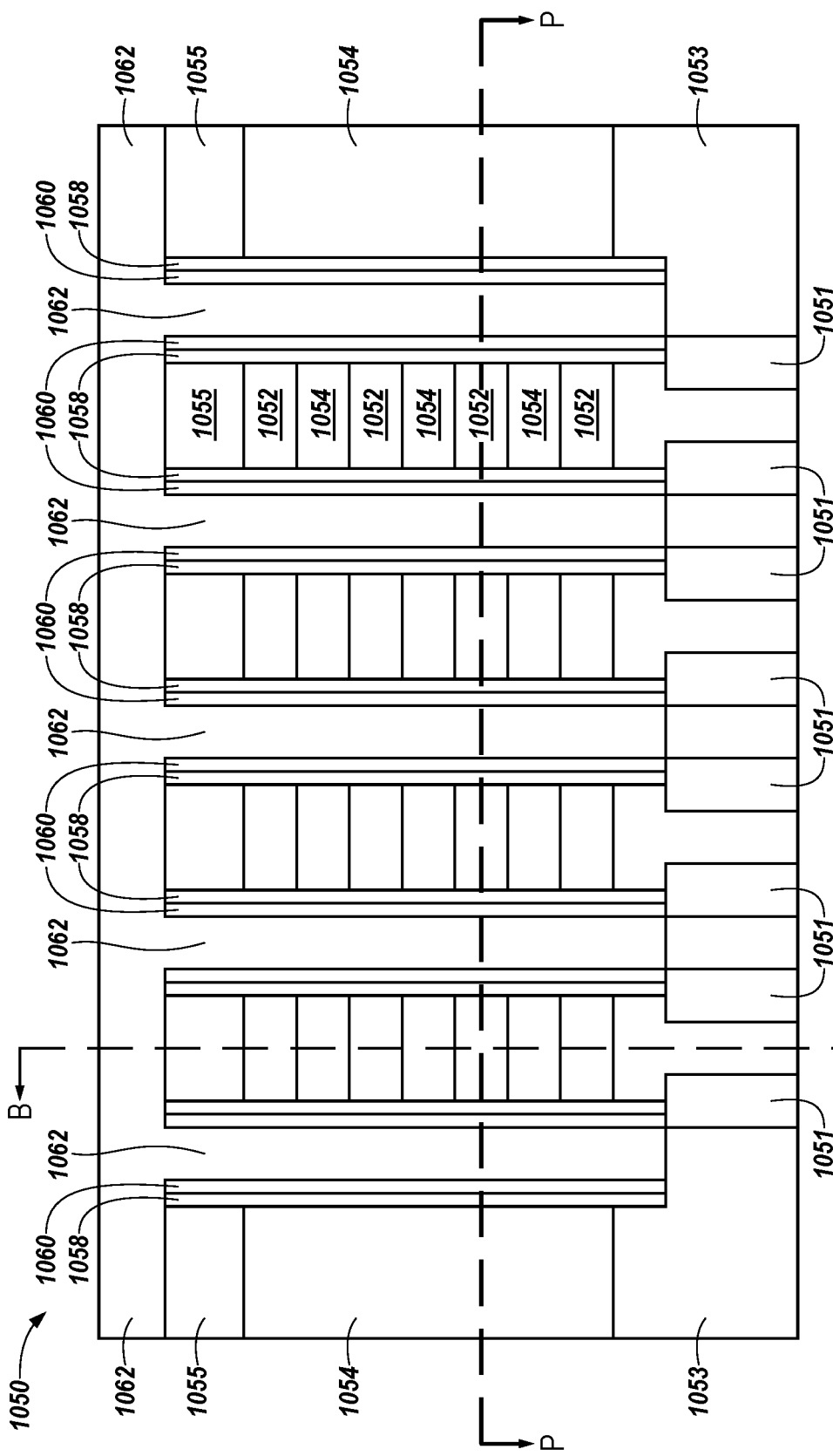
FIGS. 10A-10C illustrate various views of a subsequent processing step associated with forming the three dimensional memory array in accordance with an embodiment of the present disclosure.
Figure 10B:
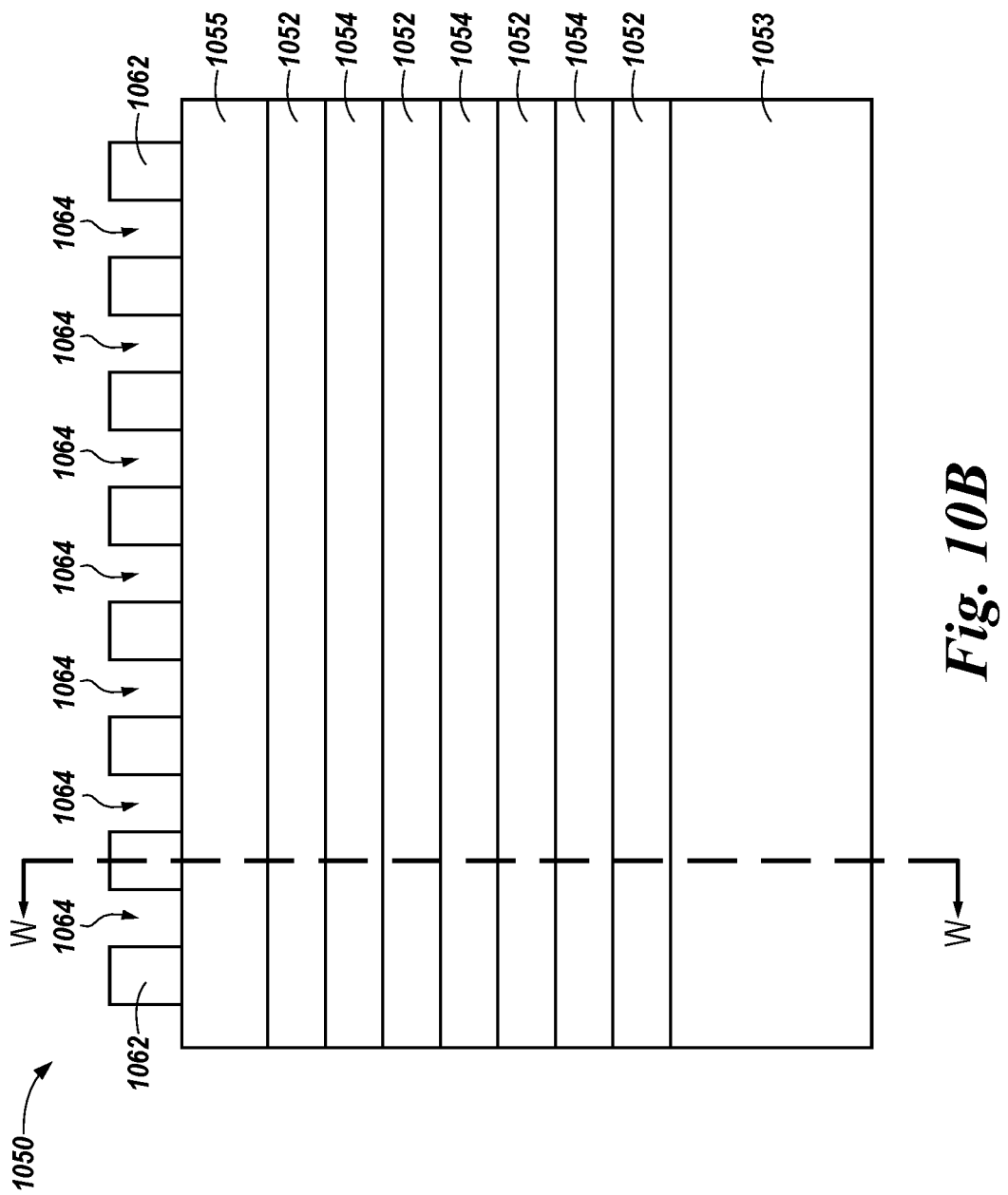
Figure 10C:
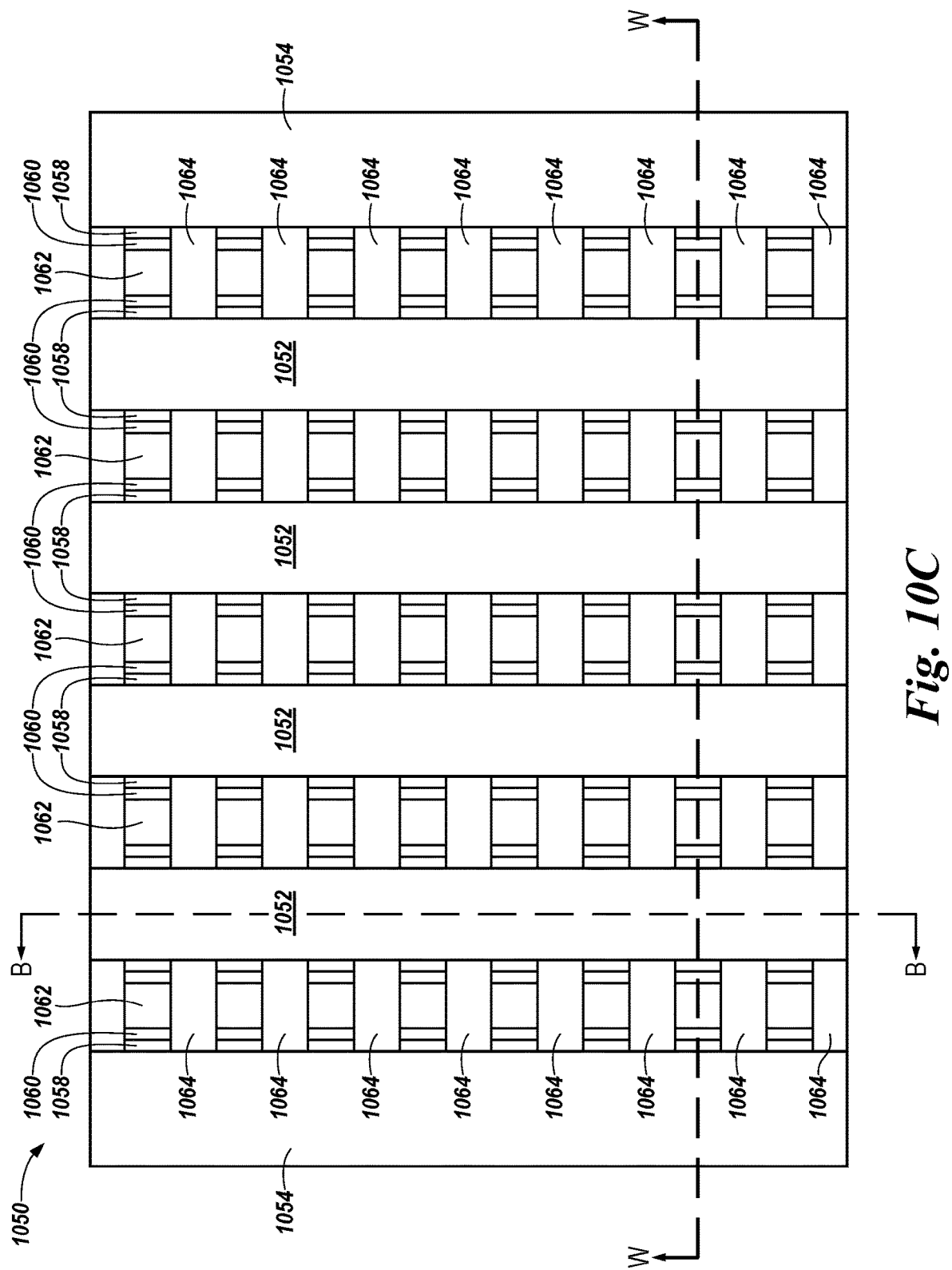

FIGS. 10A-10C illustrate various views of a subsequent processing step associated with forming the three dimensional memory array (referred to as 1050 in FIGS. 10A-10C) in accordance with an embodiment of the present disclosure. For example, FIG. 10A illustrates a schematic cross-sectional view, along cut line W-W shown in FIGS. 10B and 10C, of the structure shown in FIGS. 9A-9C after the subsequent processing step. Further, FIG. 10B illustrates a schematic cross-sectional view, along cut line B-B shown in FIGS. 10A and 10C, of the structure shown in FIGS. 9A-9C after the subsequent processing step. Further, FIG. 10C illustrates a top view, along cut line P-P shown in FIGS. 10A and 10B, of the structure shown in FIGS. 9A-9C after the subsequent processing step.

As shown in FIGS. 10A-10C, a plurality of openings (e.g., vias or holes) 1064 can be formed (e.g., etched and/or patterned) through insulation material 1062, insulation material 1055, the alternating first conductive line material 1052 and insulation material 1054, and into insulation material 1053, such that insulation material 1053 forms the bottom of each respective opening 1064, and insulation materials 1062 and 1055 and the alternating first conductive line material 1052 and insulation material 1054 form the sidewalls of each respective opening 1064. For example, the plurality of openings 1064 can be formed through the insulation material 1062 such that at least a portion of each respective opening 1064 passes through the portion of insulation material 1062 formed on insulation material 1055 (e.g., through the additional horizontally oriented plane of the array that is above the other planes of the array), and through the alternating first conductive line material 1052 and insulation material 1054 such that at least a portion of each respective opening 1064 passes through each respective first conductive line material 1052 and insulation material 1054 (e.g., through the other horizontal planes of the array), as illustrated in FIGS. 10A-10C.

By forming openings 1064, portions of second conductive line material 1060 can be removed such that the resulting area of second conductive line material 1060 may exclude the area removed in forming openings 1064. Further, as shown in FIGS. 10A-10C, the plurality of openings 1064 can be formed in a direction that is substantially perpendicular to the first conductive line material 1052, such that openings 1064 are formed between each respective first conductive line material 1052 in each respective horizontal plane. As such, openings 1064 can be formed between, and therefore separate, second conductive line material 1060 in a direction that is substantially perpendicular to first conductive line material 1052, as illustrated in FIGS. 10A-10C.

Each of the plurality of openings 1064 can be formed at the same time. For instance, each of the plurality of openings 1064 can be formed in a single etch and/or pattern using a single mask. Further, in the embodiment illustrated in FIGS. 10A-10C, each of the plurality of openings 1064 can be rectangular shaped. However, embodiments of the present disclosure are not limited to a particular shape(s) and/or size(s) for openings 1064. For example, circular, oval, and/or angled shaped openings, among others, may be formed, with sharp or rounded corners.

Figure 11A:
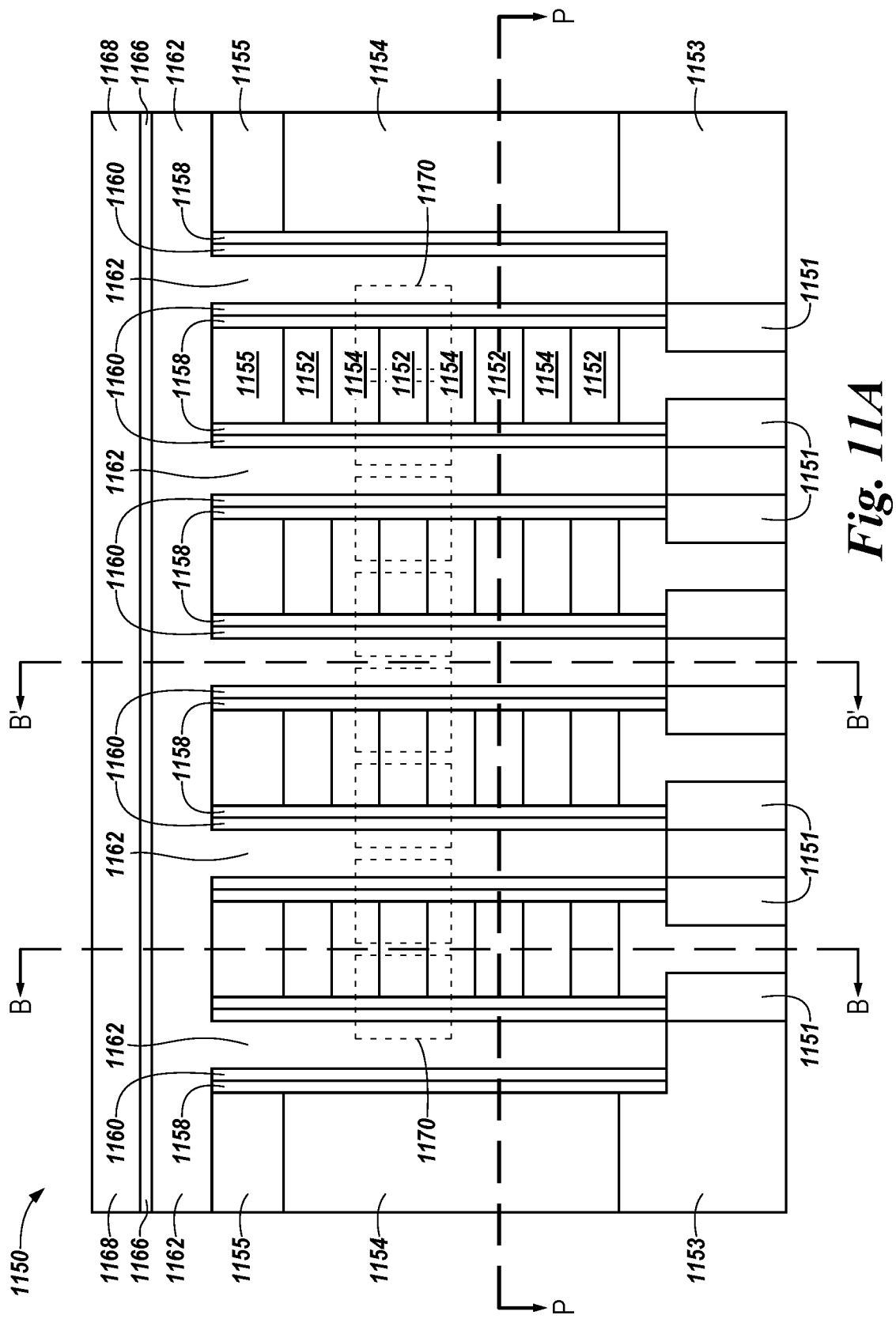
Figure 11B:
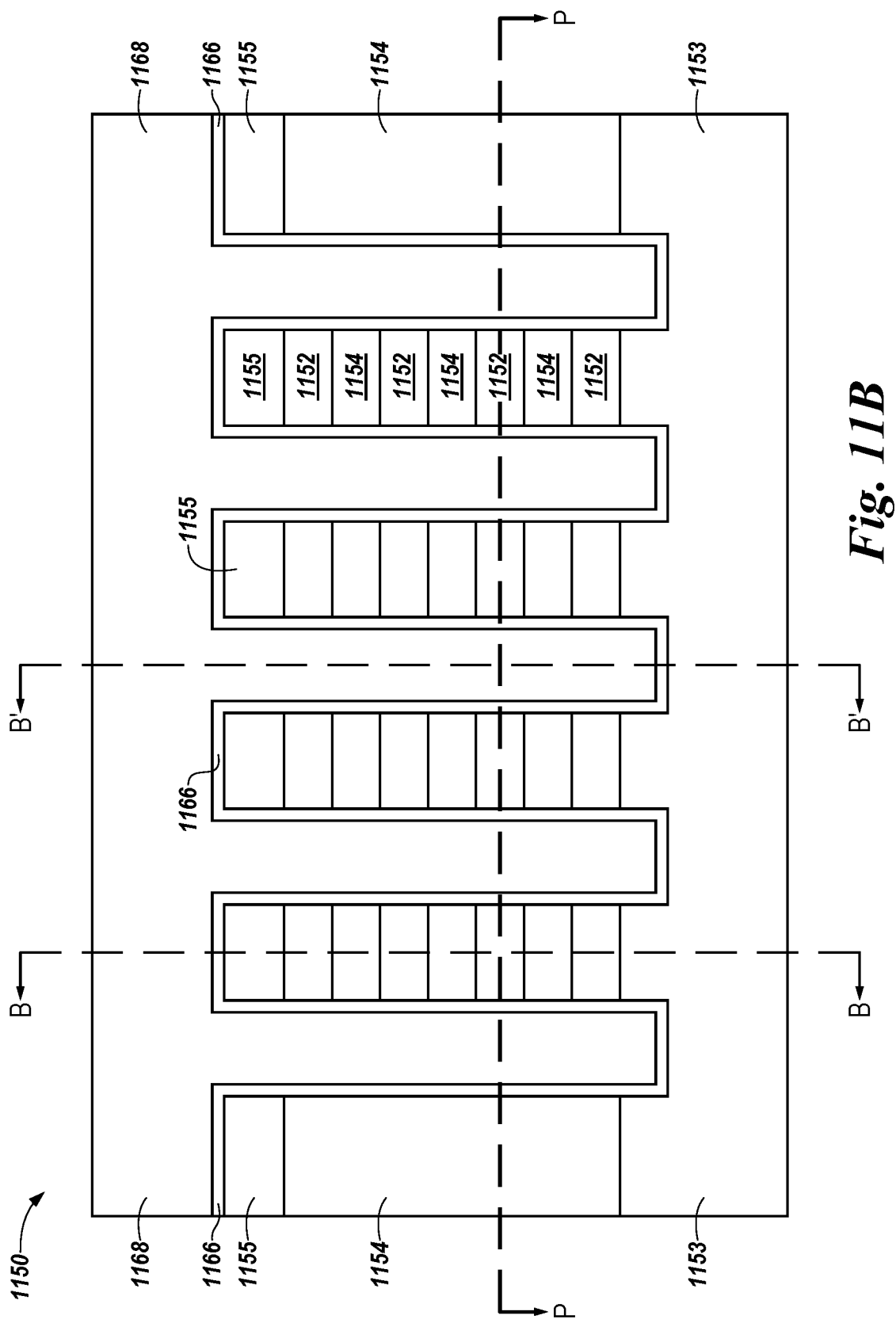
Figure 11D:
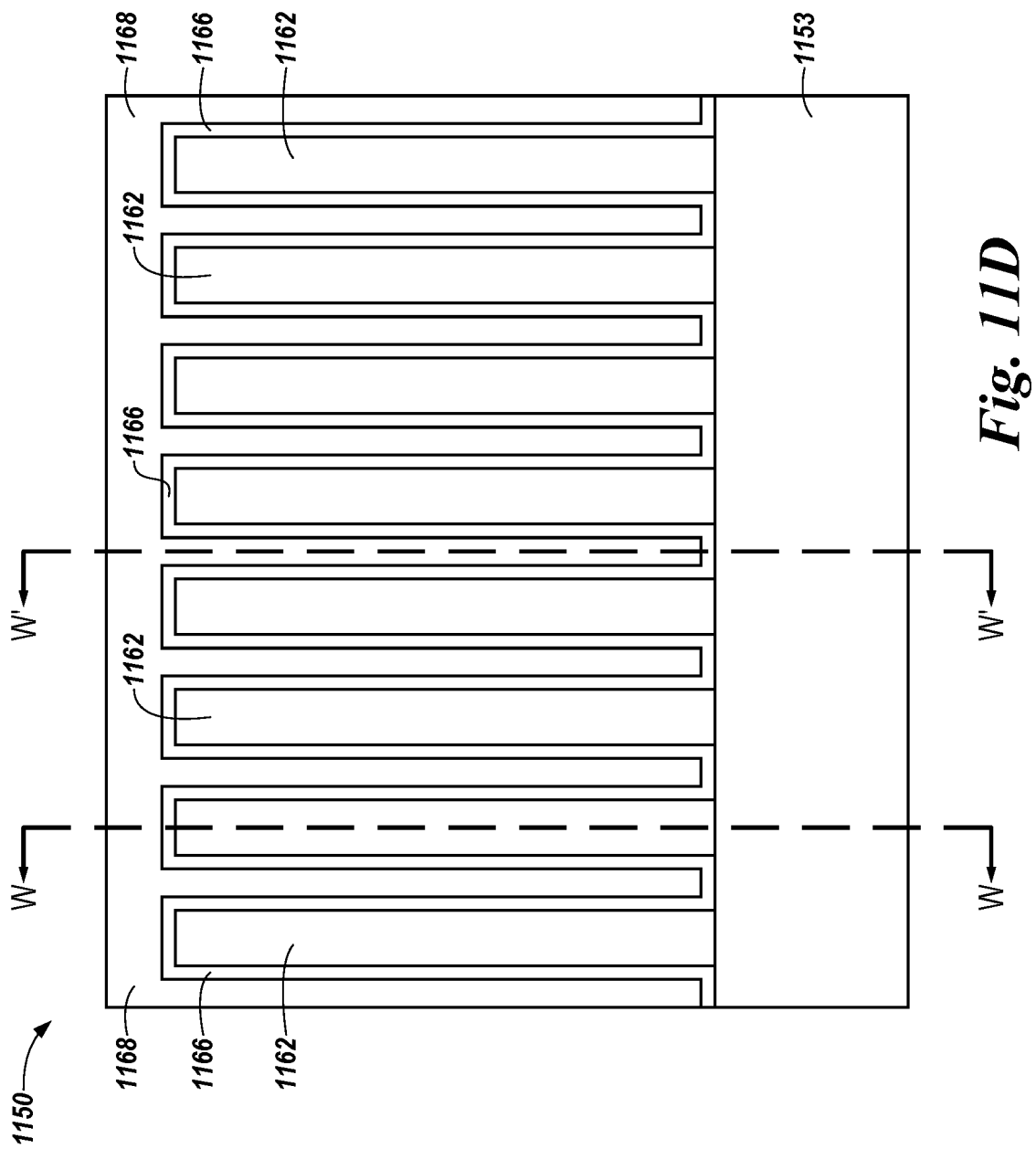

FIGS. 11A-11E illustrate various views of a subsequent processing step associated with forming the three dimensional memory array (referred to as 1150 in FIGS. 11A-11E) in accordance with an embodiment of the present disclosure. For example, FIG. 11A illustrates a schematic cross-sectional view, along cut line W-W shown in FIGS. 11C-11E, of the structure shown in FIGS. 10A-10C after the subsequent processing step. Further, FIG. 11B illustrates a schematic cross-sectional view, along cut line W'-W' shown in FIGS. 11C-11E, of the structure shown in FIGS. 10A-10C after the subsequent processing step. Further, FIG. 11C illustrates a schematic cross-sectional view, along cut line B-B shown in FIGS. 11A-11B and 11E, of the structure shown in FIGS. 10A-10C after the subsequent processing step. Further, FIG. 11D illustrates a schematic cross-sectional view, along cut line B'-B' shown in FIGS. 11A-11B and 11E, of the structure shown in FIGS. 10A-10C after the subsequent processing step. Further, FIG. 11E illustrates a top view, along cut line P-P shown in FIGS. 11A-11D, of the structure shown in FIGS. 10A-10C after the subsequent processing step.

As shown in FIGS. 11A-11E, additional insulation materials 1166 and 1168 can be formed in (e.g. fill) the plurality of openings 1064. For example, insulation material 1166 can be formed on insulation material 1062 and in openings 1064 such that insulation material 1166 is in direct contact with (e.g., seals) a first portion (e.g., side) of second conductive line material 1160, storage element material 1158, insulation material 1155, and the alternating first conductive line material 1152 and insulation material 1154 on a first side of each respective opening 1064, insulation material 1166 is in direct contact with a second portion (e.g., side) of second conductive line material 1160, storage element material 1158, insulation material 1155, and the alternating first conductive line material 1152 and insulation material 1154 on a second (e.g., opposite) side of each respective opening 1064, and insulation material 1166 is in direct contact with the portion of insulation material 1153 at the bottom of each respective opening 1064, as illustrated in FIGS. 11A-11E, but also such that insulation material 1166 does not completely fill the openings 1064.

After insulation material 1166 has been formed in openings 1064, insulation material 1168 can be formed on insulation material 1166 and in (e.g., fill) the remaining portion of openings 1064 such that insulation material 1168 is in direct contact with and between the insulation material 1166 previously formed on the opposite sides of each respective opening 1064, as illustrated in FIGS. 11A-11E.

Insulation materials 1166 and 1168 can be, for example, dielectric materials, such as, for instance, silicon oxide, silicon nitride, or silicon oxynitride. In an embodiment, insulation materials 1166 and 1168 can comprise the same dielectric material. In an additional embodiment, insulation materials 1166 and 1168 can each comprise different dielectric materials. Further, insulation materials 1166 and 1168 may comprise the same or different dielectric materials as insulation materials 1153, 1154, 1155, and/or 1162.

As shown in FIGS. 11A-11E, the storage element material 1158, the second conductive line material 1160, and the insulation material 1162 that were formed in each respective opening 856 are arranged to extend substantially perpendicular to the first conductive line material 1152 formed in the plurality of horizontally oriented planes of array 1150. In connection with FIGS. 11A-11E, the first conductive line materials can be referred to as conductive lines 1152, and the second conductive line materials formed on the opposite sides of each respective opening 856 can be referred to as conductive lines 1160. For instance, the conductive line material formed in the plurality of horizontally oriented planes can comprise conductive lines 1152 after the processing step illustrated in FIGS. 11A-11E is complete, the conductive line material formed on one side of each respective opening 856 can comprise a conductive line 1160 after the processing step illustrated in FIGS. 11A-11E is complete, and the conductive line material formed on the other side of each respective opening 856 can comprise an additional (e.g., separate) conductive line 1160 after the processing step illustrated in FIGS. 11A-11E is complete. Further, although not shown in FIGS. 11A-11E for clarity and so as not to obscure embodiments of the present disclosure, conductive lines 1160 can include one or more materials, such as, for instance, adhesion layers or barriers, as previously described herein.

As such, the storage element material 1168, the two separate conductive lines 1160, and the insulation material 1162 formed in each respective opening 856 can comprise a vertical stack of array 1150. That is, array 1150 can include a plurality of vertical stacks, wherein each respective stack includes a first conductive line 1160 and a second conductive line 1160 both arranged to extend substantially perpendicular to and pass through conductive lines 1152 and insulation material 1154, a storage element material 1158 formed between and in direct contact with conductive lines 1152 and the first and second conductive lines 1160 where they pass through conductive lines 1152 in the stack, and an insulation material 1162 formed between and in direct contact with the first and second conductive lines 1160, as illustrated in FIGS. 11A-11E. The storage element material 1158 of each respective stack may be between and in direct contact with a first portion (e.g., first side) of each respective conductive line 1152 in the stack and one of the conductive lines 1160 in the stack, and the storage element material 1158 may also be between and in direct contact with a second portion (e.g., the opposite side) of each respective conductive line 1152 in the stack and the other one of the conductive line 1160 in the stack, as illustrated in FIGS. 11A-11E.

Further, each respective stack may include one or two of the conductive plugs 1151. For example, each respective stack may include the conductive plug or plugs 1151 that are coupled to (e.g., in direct contact with) the storage element material 1158 and conductive line or lines 1160 of that stack. The conductive plugs 1151 can be used to separately select the conductive (e.g., word) lines 1160 of the vertical stacks during a program or sense operation performed on array 1150, as will be further described herein (e.g., in connection with FIG. 12).

As shown in FIGS. 11A-11E, a plurality of memory cells 1170 can be formed in each respective horizontal plane of array 1150 formed by conductive lines 1152. For instance, memory cells 1170 can be formed substantially at the same levels as the data (e.g., bit) lines of array 1150 are formed, such that a memory cell is substantially co-planar with the conductive line 1152 that comprises that cell.

For example, as illustrated in FIGS. 11A-11E, each respective memory cell 1170 can comprise a portion of one of conductive lines 1152, a portion of one of conductive lines 1160, and a portion of storage element material 1158. The portion of storage element material 1158 that comprises the cell can be between and in direct contact with the portions of the conductive lines 1152 and 1160 that comprise that cell, as illustrated in FIGS. 11A-11E.

Further, each respective memory cell 1170 can comprise portions of insulation materials 1153, 1154, and/or 1155. For instance, each respective memory cell can comprise a portion of the insulation material 1153 or 1154 in direct contact with a third portion (e.g., the bottom) of the conductive line 1152 of that cell, and a portion of the insulation material 1154 or 1155 in direct contact with a fourth portion (e.g., the top) of the conductive line 1152 of that cell, as illustrated in FIGS. 11A-11E.

Further, each respective memory cell 1170 can comprise portions of insulation materials 1166 and 1168. For instance, each respective memory cell can comprise portions of insulation material 1166 that are in direct contact with the conductive line 1152, conductive line 1160, and storage element material 1158 of that cell, and portions of insulation material 1168 that are in direct contact with the insulation material 1166 of that cell, as illustrated in FIGS. 11A-11E.

Figure 12:
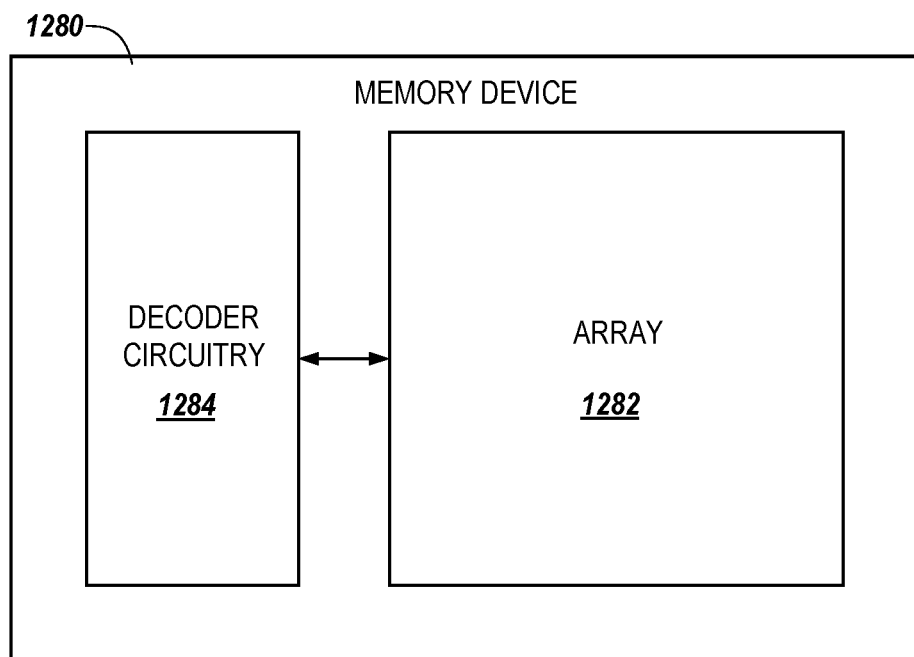
FIG. 12 is a block diagram of an apparatus in the form of a memory device in accordance with an embodiment of the present disclosure.

FIG. 12 is a block diagram of an apparatus in the form of a memory device 1280 in accordance with an embodiment of the present disclosure. As used herein, an "apparatus" can refer to, but is not limited to, any of a variety of structures or combinations of structures, such as a circuit or circuitry, a die or dies, a module or modules, a device or devices, or a system or systems, for example.

As shown in FIG. 12, memory device 1280 can include a memory array 1282. Memory array 1282 can be, for example, three dimensional memory array 500 previously described in connection with FIGS. 5A-5E, or three dimensional memory array 1150 previously described in connection with FIGS. 11A-11E. Although a single memory array 1280 is shown in FIG. 12 for clarity and so as not to obscure embodiments of the present disclosure, memory device 1280 may include any number of memory arrays analogous to array 1282.

As shown in FIG. 12, memory device 1280 can include decoder circuitry 1284 coupled to array 1282. As used herein, decoder circuitry 1284 can include and/or refer to row decoder and/or column decoder circuitry. In an embodiment, decoder circuitry 1284 can be included on the same physical device (e.g., the same die) as array 1282. For instance, decoder circuitry 1284 may be built into the substrate of array 1282. In an embodiment, decoder circuitry 1284 can be included on a separate physical device that is communicatively coupled to the physical device that includes array 1282.

Decoder circuitry 1284 can receive and decode address signals to access the memory cells of memory array 1282 during program and/or sense operations performed on array 1282. For example, decoder circuitry 1284 can include circuitry for use in selecting a particular memory cell of array 1282 to access during a program or sense operation.

For instance, in an embodiment in which memory array 1282 is three dimensional memory array 500 previously described in connection with FIGS. 5A-5E, decoder circuitry 1284 may include word line driver circuitry coupled to each respective conductive extension of the array (e.g., to the conductive extension of each respective vertical plane of the array). As such, each of the shunted word lines 510 in the vertical stacks of a particular vertical plane of the array can be coupled to the word line driver circuitry via the conductive extension of that vertical plane, such that decoder circuitry 1284 may simultaneously select (e.g., apply a voltage to) the word line 510 of each vertical stack in that plane. Further, in such an embodiment, decoder circuitry 1284 may include bit line driver circuitry separately coupled to each respective bit line 502 of the array, such that decoder circuitry 1284 may select a single (e.g., only one) bit line 502 at a time.

As an example, during a program operation to program a memory cell of memory array 1282 in such an embodiment (e.g., an embodiment in which memory array 1282 is array 500) with a particular voltage (e.g., Vp), decoder circuitry 1284 may apply a voltage of Vp/2 to the single bit line that comprises the cell using the bit line driver circuitry, and may apply a voltage of −Vp/2 to the conductive extension coupled to (e.g., the vertical plane that includes) the word line that comprises the cell using the word line driver circuitry. As an additional example, during a sense operation performed with a particular voltage (e.g., Vr) in such an embodiment, decoder circuitry 1284 may apply a voltage of Vr/2 to the single bit line that comprises the cell using the bit line driver circuitry, and may apply a voltage of −Vr/2 to the conductive extension coupled to the word line that comprises the cell using the word line driver circuitry. In both examples, the unselected bit lines and word lines may remain biased at ground.

In an embodiment in which memory array 1282 is three dimensional memory array 1150 previously described in connection with FIGS. 11A-11E, decoder circuitry 1284 may include word line driver circuitry coupled to each respective conductive plug 1151 of the array. As such, each respective word line 1160 of the array may be coupled to the word line driver circuitry via the plug that is coupled to that word line, such that decoder circuitry 1284 may select a single (e.g., only one) word line 1160 at a time. Further, in such an embodiment, decoder circuitry 1284 may include bit line driver circuitry coupled to each respective horizontal plane of the array (e.g., to the bit lines of each respective vertical plane of the array). As such, each of the bit lines 1152 of a particular horizontal plane of the array can be coupled to the bit line driver circuitry together, such that decoder circuitry 1284 may simultaneously select each of the bit lines 1152 in that plane.

As an example, during a program operation to program a memory cell of memory array 1282 in such an embodiment (e.g., an embodiment in which memory array 1282 is array 1150) with a particular voltage (e.g., Vp), decoder circuitry 1284 may apply a voltage of Vp/2 to each of the bit lines in the horizontal plane that includes the bit line that comprises the cell using the bit line driver circuitry, and may apply a voltage of −Vp/2 to only the single conductive plug coupled to the word line that comprises the cell using the word line driver circuitry. As an additional example, during a sense operation performed with a particular voltage (e.g., Vr) in such an embodiment, decoder circuitry 1284 may apply a voltage of Vr/2 to each of the bit lines in the horizontal plane that includes the bit line that comprises the cell using the bit line driver circuitry, and may apply a voltage of −Vr/2 to only the single conductive plug coupled to the word line that comprises the cell using the word line driver circuitry. In both examples, the unselected bit lines and word lines may remain biased at ground.

The embodiment illustrated in FIG. 12 can include additional circuitry, logic, and/or components not illustrated so as not to obscure embodiments of the present disclosure. For example, memory device 1280 can include a controller to send commands to perform operations on memory array 1282, such as operations to sense (e.g., read), program (e.g., write), move, and/or erase data, among other operations. Further, memory device 1280 can include address circuitry to latch address signals provided over I/O connectors through I/O circuitry. Further, memory device 1280 can include a main memory, such as, for instance, a DRAM or SDRAM, that is separate from and/or in addition to memory array(s) 1282.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of processing a three dimensional memory array, comprising:
    forming a first conductive line material in a plurality of planes separated from one another by a first insulation material;
    forming a plurality of openings through the first conductive line material in the plurality of planes;
    forming a storage element material in the plurality of openings such that:
        the storage element material is in direct contact with a first portion of the first conductive line material on a first side of the plurality of openings in the plurality of planes; and
        the storage element material is in direct contact with a second portion of the first conductive line material on a second side of the plurality of openings in the plurality of planes;
    forming a second conductive line material in the plurality of openings such that the second conductive line material is in direct contact with and between the storage element material in the plurality of openings in the plurality of planes;
    forming a second insulation material in the plurality of openings such that the second insulation material is in direct contact with and between the second conductive line material in the plurality of openings in the plurality of planes;
    forming the plurality of openings through the first conductive line material in the plurality of planes such that a bottom of each respective opening is formed by a portion of a first conductive plug and a portion of a second conductive plug; and
    forming the storage element material in the plurality of openings such that:
        the storage element material that is in direct contact with the first portion of the first conductive line material on the first side of the plurality of openings is also in direct contact with the portion of one of the first conductive plug and the second conductive plug at the bottom of the plurality of openings; and
        the storage element material that is in direct contact with the second portion of the first conductive line material on the second side of the plurality of openings is also in direct contact with the portion of the other one of the first conductive plug and the second conductive plug at the bottom of the plurality of openings.

2. The method of claim 1, wherein the method includes forming the second conductive line material in the plurality of openings such that the second conductive line material is in direct contact with the portion of the first conductive plug and the portion of the second conductive plug at the bottom of the plurality of openings.

3. The method of claim 1, wherein the method includes forming the second insulation material in an additional plane that has a same orientation as the plurality of planes.

4. The method of claim 3, wherein the method includes:
    forming a plurality of openings in the second insulation material in the additional plane;
    forming a third insulation material in plurality of openings in the second insulation material such that:
        the third insulation material is in direct contact with a first portion of the second insulation material on a first side of the plurality of openings in the second insulation material; and
        the third insulation material is in direct contact with a second portion of the second insulation material on a second side of the plurality of openings in the second insulation material; and
    forming a fourth insulation material in the plurality of openings in the second insulation material such that the fourth insulation material is in direct contact with and between the third insulation material in the plurality of openings in the second insulation material.

5. A method of processing a three dimensional memory array, comprising:
    forming a first instance of a storage element material at least partially between and at least partially in direct contact with a first portion of one of a first plurality of conductive lines and a portion of a first one of a second plurality of conductive lines;
    forming a second instance of the storage element material at least partially between and at least partially in direct contact with a second portion of the one of the first plurality of conductive lines and a portion of a second one of the second plurality of conductive lines;
    forming a first conductive plug in contact with the first one of the second plurality of conductive lines and the first instance of the storage element material; and
    forming a second conductive plug in contact with the second one of the second plurality of conductive lines and the second instance of the storage element material.

6. The method of claim 5, wherein the storage element material comprises a self-selecting storage element material.

7. The method of claim 5, wherein the storage element material comprises a chalcogenide material.

8. The method of claim 5, further comprising:
    forming an insulation material separating the first plurality of conductive lines from one another; and forming the second plurality of conductive lines extending substantially perpendicular to and passing through the first plurality of conductive lines and the insulation material.

9. The method of claim 8, wherein the insulation material comprises a dielectric material.

10. The method of claim 8, further comprising forming a plurality of conductive extensions in contact with the second plurality of conductive lines and extending substantially parallel to the first plurality of conductive lines.

11. The method of claim 10, further comprising forming an additional insulation material separating the plurality of conductive extensions from one another.

12. The method of claim 5, further comprising forming circuitry in contact with the first plurality of conductive lines and the second plurality of conductive lines, wherein the circuitry is configured to, during a program operation or sense operation performed on the array:
 select a single one of the first plurality of conductive lines; and
 select a single one of the first one or the second one of the plurality of the second conductive lines.

13. The method of claim 5, further comprising forming an insulation material separating the first conductive plug from the second conductive plug.

14. A method of processing a three dimensional memory array, comprising:
 forming a first conductive line material in a plurality of planes separated from one another by a first insulation material;
 forming a plurality of openings through the first conductive line material in the plurality of planes;
 forming a storage element material in the plurality of openings such that:
  the storage element material is in direct contact with a first portion of the first conductive line material on a first side of the plurality of openings in the plurality of planes; and
  the storage element material is in direct contact with a second portion of the first conductive line material on a second side of the plurality of openings in the plurality of planes;
 forming a second conductive line material in the plurality of openings such that the second conductive line material is in direct contact with and between the storage element material in the plurality of openings in the plurality of planes;
 forming a second insulation material in the plurality of openings such that the second insulation material is in direct contact with and between the second conductive line material in the plurality of openings in the plurality of planes;
 forming the second insulation material in an additional plane that has a same orientation as the plurality of planes;
 forming a plurality of openings in the second insulation material in the additional plane;
 forming a third insulation material in plurality of openings in the second insulation material such that:
  the third insulation material is in direct contact with a first portion of the second insulation material on a first side of the plurality of openings in the second insulation material; and
  the third insulation material is in direct contact with a second portion of the second insulation material on a second side of the plurality of openings in the second insulation material; and
 forming a fourth insulation material in the plurality of openings in the second insulation material such that the fourth insulation material is in direct contact with and between the third insulation material in the plurality of openings in the second insulation material.

* * * * *